United States Patent
Kajigaya

(10) Patent No.: US 7,486,584 B2
(45) Date of Patent: Feb. 3, 2009

(54) SEMICONDUCTOR MEMORY DEVICE AND REFRESH CONTROL METHOD THEREOF

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/842,662

(22) Filed: Aug. 21, 2007

(65) Prior Publication Data

US 2008/0049532 A1 Feb. 28, 2008

(30) Foreign Application Priority Data

Aug. 22, 2006 (JP) ............................. 2006-225851

(51) Int. Cl.
*G11C 7/00* (2006.01)
(52) U.S. Cl. .................. 365/222; 365/195; 365/230.06
(58) Field of Classification Search ................. 365/222, 365/195, 196, 230.03, 230.06
See application file for complete search history.

(56) References Cited

U.S. PATENT DOCUMENTS

| | | | | |
|---|---|---|---|---|
| 4,485,378 | A * | 11/1984 | Matsui et al. ................. | 345/28 |
| 5,208,469 | A * | 5/1993 | Hodoshima ................. | 257/208 |
| 6,215,714 | B1 | 4/2001 | Takemae et al. | |
| 6,426,908 | B1 * | 7/2002 | Hidaka ........................ | 365/222 |
| 6,487,136 | B2 * | 11/2002 | Hidaka ........................ | 365/222 |
| 6,590,822 | B2 * | 7/2003 | Hwang et al. ............... | 365/222 |
| 6,819,618 | B2 * | 11/2004 | Kashiwazaki ................ | 365/222 |
| 2002/0191466 | A1 | 12/2002 | Hawang et al. | |
| 2002/0191467 | A1 | 12/2002 | Matsumoto et al. | |
| 2003/0206427 | A1 | 11/2003 | Hwang et al. | |
| 2004/0165465 | A1 | 8/2004 | Kashiwazaki et al. | |
| 2006/0104139 | A1 | 5/2006 | Hur et al. | |

FOREIGN PATENT DOCUMENTS

| | | |
|---|---|---|
| JP | 2-192096 A | 7/1990 |
| JP | 2000298982 A | 10/2000 |
| JP | 200193278 A | 4/2001 |
| JP | 2002-334576 A | 11/2002 |
| JP | 2002373489 A | 12/2002 |
| JP | 2004-259343 A | 9/2004 |
| JP | 2006147123 A | 6/2006 |

* cited by examiner

*Primary Examiner*—Gene N. Auduong
(74) *Attorney, Agent, or Firm*—Sughrue Mion, PLLC

(57) ABSTRACT

A semiconductor memory device has a refresh control circuit for switchingly controlling a first refresh mode in which access to the memory cell array from outside is prohibited while retaining data and a second refresh mode in which access to the memory cell array from outside is permitted while retaining data and for performing the refresh operation of the memory cells corresponding to a selected word line, and a designating circuit for individually designating a portion to be refreshed in the first refresh mode and a portion to be refreshed in the second refresh mode. In the semiconductor memory device, the refresh control circuit performs the refresh operation when the portion to which the selected word line belongs is designated to be refreshed, and does not perform the refresh operation when the portion to which the selected word line belongs is not designated to be refreshed.

19 Claims, 28 Drawing Sheets

FIG.3

SETTING EXAMPLES OF REFRESH (DATA IN THE MODE REGISTER)

| | AUTO REFRSH ||||||||| SELF REFRESH |||||||||
| | AREA DESIGNATION DATA |||| BANK DESIGNATION DATA |||| AREA DESIGNATION DATA |||| BANK DESIGNATION DATA ||||
| | S0 | S1 | S2 | S3 | S4 | S5 | S6 | S7 | S0 | S1 | S2 | S3 | S4 | S5 | S6 | S7 |
|---|---|---|---|---|---|---|---|---|---|---|---|---|---|---|---|---|
| FIRST SETTING EXAMPLE | 1 | 1 | 1 | 1 | 1 | 1 | 0 | 0 | 1 | 1 | 1 | 1 | 1 | 1 | 1 | 1 |
| SECOND SETTING EXAMPLE | 1 | 1 | 1 | 1 | 1 | 0 | 0 | 0 | 1 | 1 | 1 | 1 | 1 | 1 | 1 | 1 |
| THIRD SETTING EXAMPLE | 1 | 1 | 0 | 0 | 1 | 1 | 1 | 1 | 1 | 1 | 1 | 1 | 1 | 1 | 1 | 1 |
| FOURTH SETTING EXAMPLE | 1 | 0 | 0 | 0 | 1 | 1 | 1 | 1 | 1 | 1 | 1 | 1 | 1 | 1 | 1 | 1 |
| FIFTH SETTING EXAMPLE | 1 | 1 | 1 | 1 | 1 | 1 | 0 | 0 | 1 | 1 | 1 | 1 | 0 | 0 | 1 | 1 |
| SIXTH SETTING EXAMPLE | 1 | 1 | 1 | 1 | 1 | 0 | 0 | 0 | 1 | 1 | 1 | 1 | 0 | 0 | 1 | 1 |
| SEVENTH SETTING EXAMPLE | 1 | 1 | 0 | 0 | 1 | 1 | 1 | 1 | 0 | 0 | 1 | 1 | 1 | 1 | 1 | 1 |
| EIGHTH SETTING EXAMPLE | 1 | 0 | 0 | 0 | 1 | 1 | 1 | 1 | 0 | 1 | 1 | 1 | 1 | 1 | 1 | 1 |
| NINTH SETTING EXAMPLE | 1 | 1 | 1 | 1 | 1 | 1 | 0 | 0 | 1 | 1 | 0 | 0 | 1 | 1 | 0 | 0 |
| TENTH SETTING EXAMPLE | 1 | 1 | 1 | 1 | 1 | 0 | 0 | 0 | 1 | 1 | 0 | 0 | 1 | 1 | 0 | 0 |
| ELEVENTH SETTING EXAMPLE | 1 | 1 | 0 | 0 | 1 | 1 | 1 | 1 | 1 | 1 | 1 | 1 | 1 | 1 | 1 | 1 |
| TWELFTH SETTING EXAMPLE | 1 | 0 | 0 | 0 | 1 | 1 | 1 | 1 | 1 | 1 | 1 | 1 | 1 | 1 | 1 | 1 |
| THIRTEENTH SETTING EXAMPLE | 1 | 1 | 1 | 1 | 1 | 0 | 0 | 0 | 1 | 1 | 0 | 0 | 1 | 0 | 0 | 0 |
| FOURTEENTH SETTING EXAMPLE | 1 | 1 | 1 | 1 | 0 | 1 | 1 | 1 | 1 | 1 | 0 | 0 | 1 | 1 | 1 | 1 |
| FIFTEENTH SETTING EXAMPLE | 1 | 1 | 0 | 0 | 1 | 1 | 1 | 1 | 1 | 1 | 0 | 0 | 1 | 0 | 0 | 0 |
| SIXTEENTH SETTING EXAMPLE | 1 | 0 | 0 | 0 | 1 | 1 | 1 | 1 | 0 | 0 | 0 | 0 | 1 | 1 | 0 | 0 |

FIG.4A
FIRST SETTING EXAMPLE
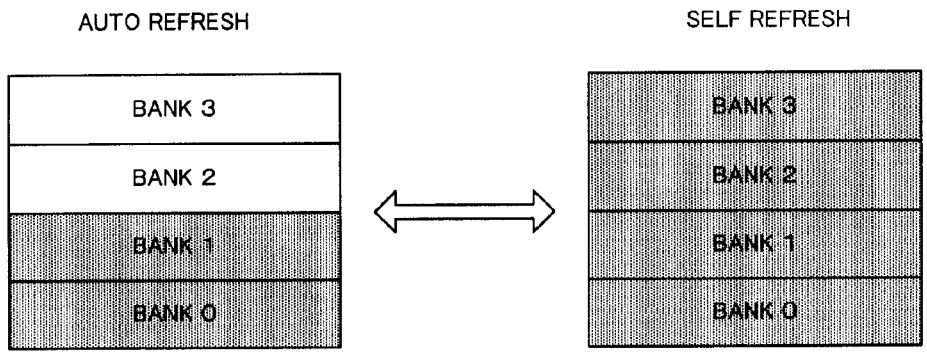
FIG.4B
SECOND SETTING EXAMPLE
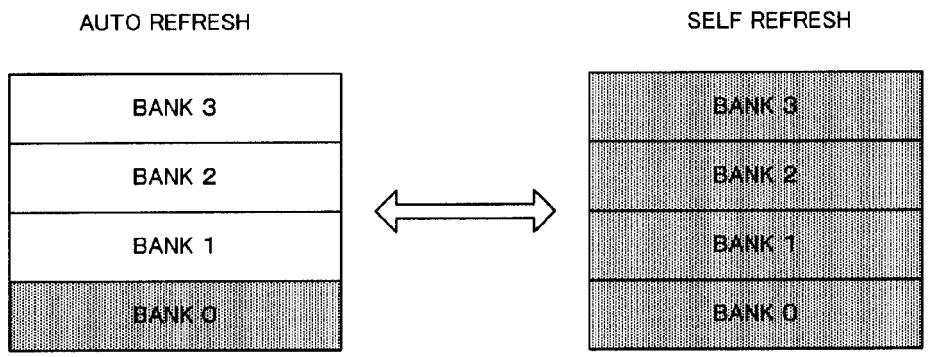
 : TO BE REFRESHED
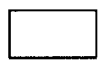 : NOT TO BE REFRESHED

THIRD SETTING EXAMPLE

FOURTH SETTING EXAMPLE

: TO BE REFRESHED

: NOT TO BE REFRESHED

FIG.6A
FIFTH SETTING EXAMPLE
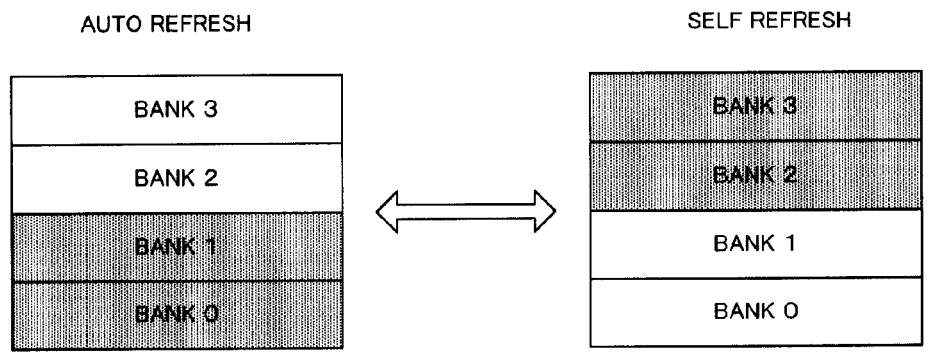
FIG.6B
SIXTH SETTING EXAMPLE
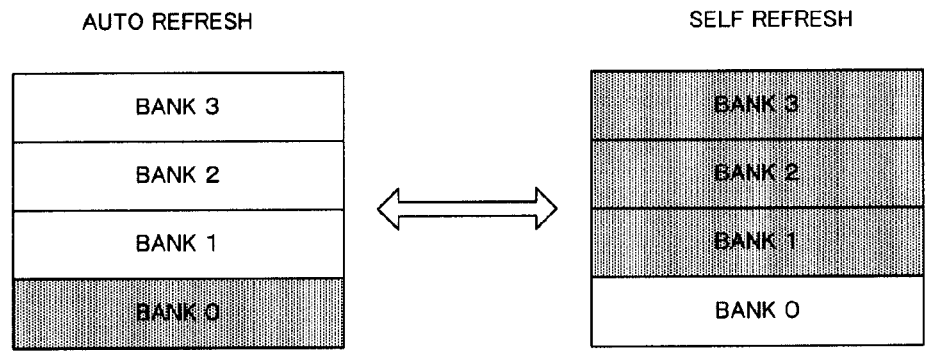
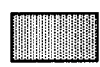 : TO BE REFRESHED
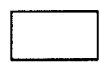 : NOT TO BE REFRESHED

FIG.7A
SEVENTH SETTING EXAMPLE
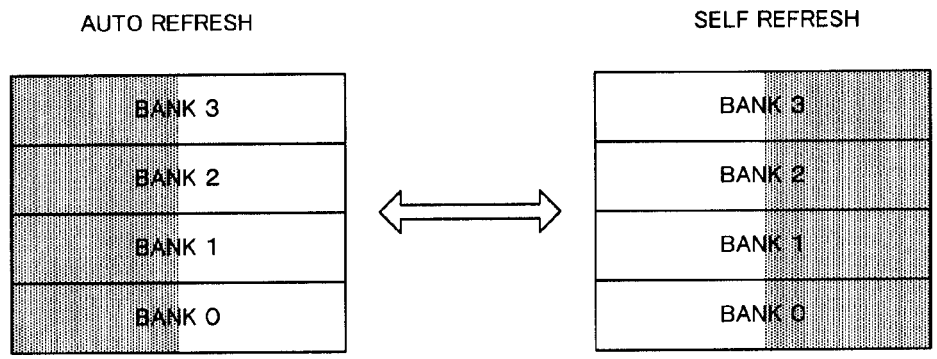
FIG.7B
EIGHTH SETTING EXAMPLE
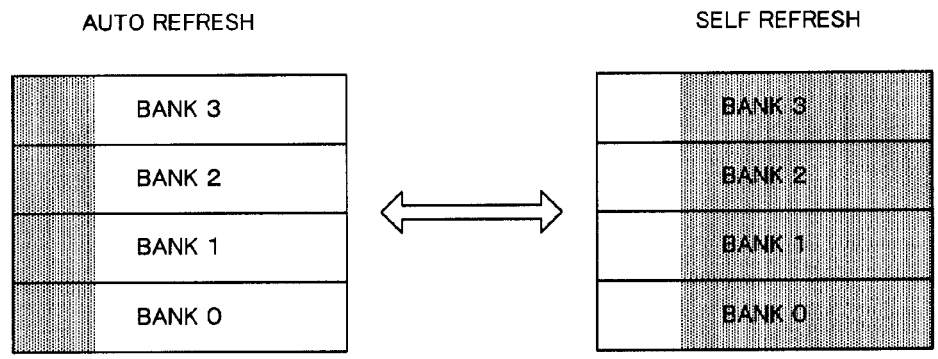
 : TO BE REFRESHED
 : NOT TO BE REFRESHED

FIG.8A
NINTH SETTING EXAMPLE
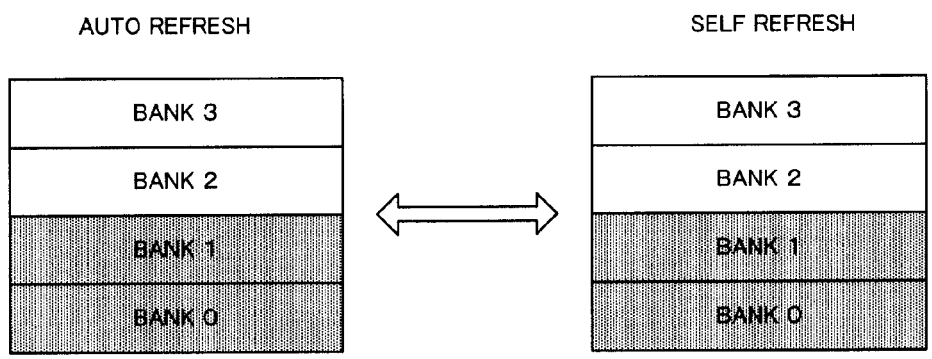
FIG.8B
TENTH SETTING EXAMPLE
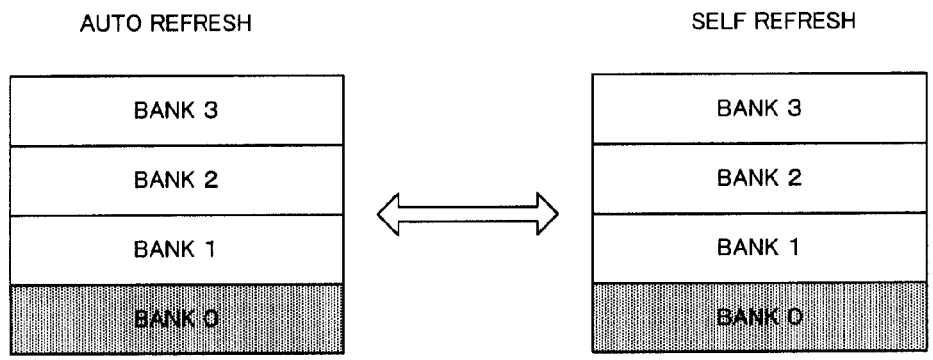
 : TO BE REFRESHED
 : NOT TO BE REFRESHED

FIG.9A
ELEVENTH SETTING EXAMPLE
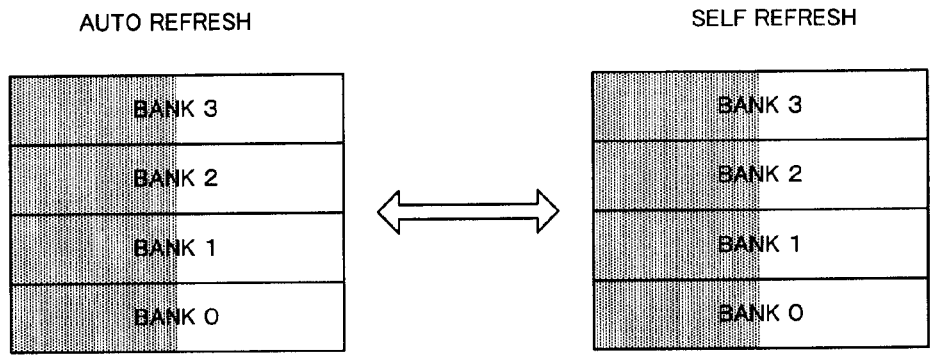
FIG.9B
TWELFTH SETTING EXAMPLE
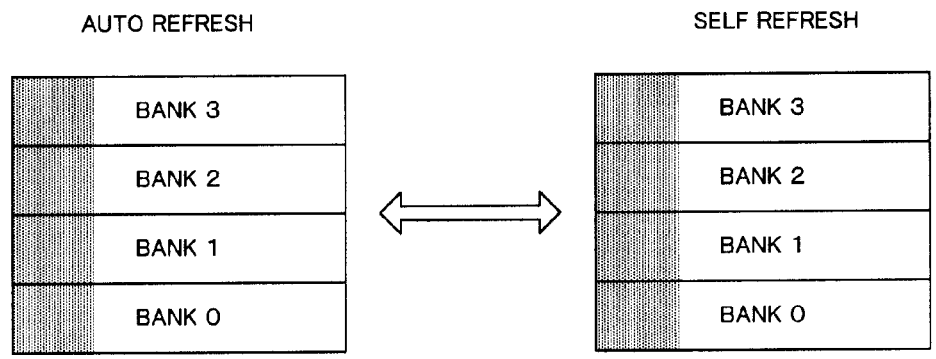
 : TO BE REFRESHED
 : NOT TO BE REFRESHED

FIG.10A
THIRTEENTH SETTING EXAMPLE
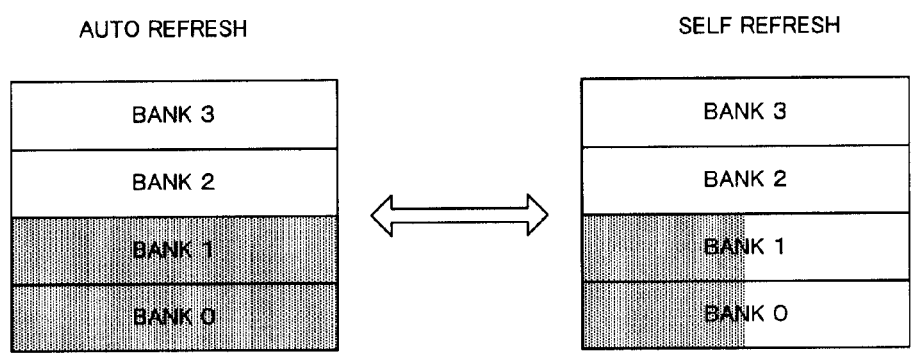
FIG.10B
FOURTEENTH SETTING EXAMPLE
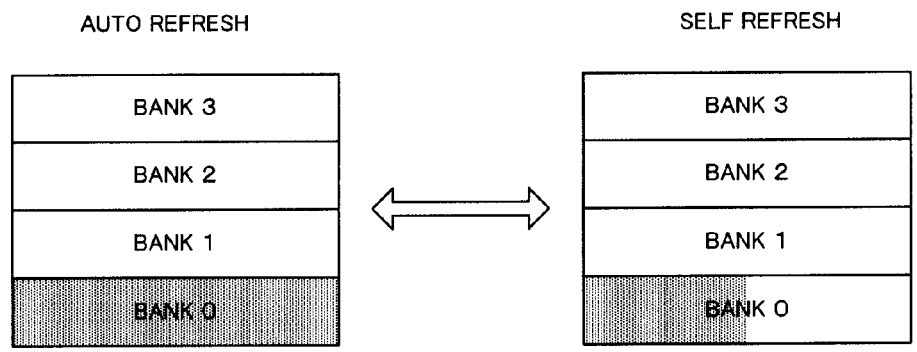
 : TO BE REFRESHED
 : NOT TO BE REFRESHED

FIG.11A
FIFTEENTH SETTING EXAMPLE
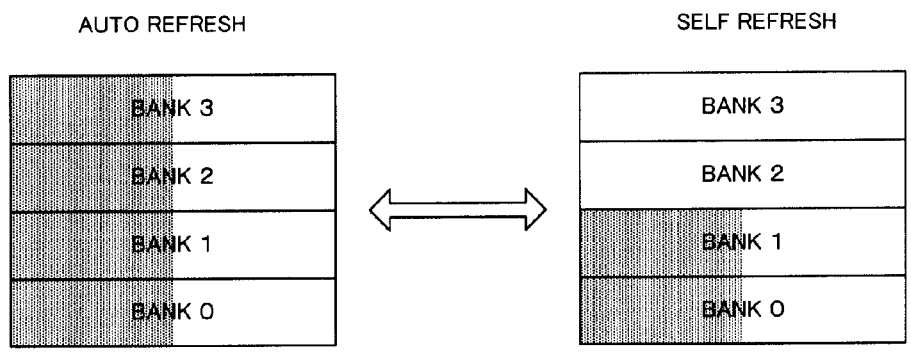
FIG.11B
SIXTEENTH SETTING EXAMPLE
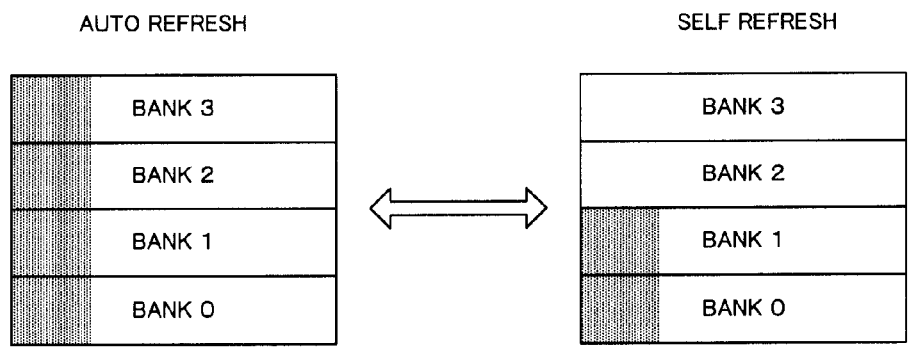
 : TO BE REFRESHED
 : NOT TO BE REFRESHED

BANK INNER AREA REFRESH COUNTER

BANK SELECTION ADDRESS COUNTER

REFRESH FOR EACH SINGLE BANK (1)

REFRESH FOR EACH SINGLE BANK (2)

SIMULTANEOUS REFRESH FOR 2 BANKS (1)

SIMULTANEOUS REFRESH FOR 2 BANKS (2)

SIMULTANEOUS REFRESH FOR 4 BANKS (1)

SIMULTANEOUS REFRESH FOR 4 BANKS (2)

BANK INNER AREA REFRESH COUNTER

AREA SELECTION SWITCH

FIG.21

| MODE REGISTER (AREA DESIGNATION DATA) | | | | CTB | SWITCHING CONTROL | | | AREAS IN THE BANK |
|---|---|---|---|---|---|---|---|---|
| S0 | S1 | S2 | S3 | | 201 | 202 | 203 | |
| 1 | 1 | 1 | 1 | CAn | b | b | b | |
| 1 | 1 | 0 | 0 | CAn-1 | b | b | c | |
| 0 | 0 | 1 | 1 | CAn-1 | b | b | a | |
| 1 | 0 | 1 | 0 | CAn-1 | a | c | b | |
| 0 | 1 | 0 | 1 | CAn-1 | a | a | b | |
| 1 | 0 | 0 | 0 | CAn-2 | × | c | c | |
| 0 | 1 | 0 | 0 | CAn-2 | × | a | c | |
| 0 | 0 | 1 | 0 | CAn-2 | × | c | a | |
| 0 | 0 | 0 | 1 | CAn-2 | × | a | a | |

× : DON'T CARE

BANK SELECTION ADDRESS COUNTER

BANK SELECTION SWITCH

FIG.23

| MODE REGISTER (AREA DESIGNATION DATA) | | | | DESIGNATED BANKS | SWITCHING CONTROL | | |
|---|---|---|---|---|---|---|---|
| S4 | S5 | S6 | S7 | | 204 | 205 | 206 |
| 1 | 1 | 1 | 1 | BANKS 0~3 | b | b | b |
| 1 | 1 | 0 | 0 | BANKS 0, 1 | b | b | c |
| 0 | 0 | 1 | 1 | BANKS 2, 3 | b | b | a |
| 1 | 0 | 1 | 0 | BANKS 0, 2 | a | c | b |
| 0 | 1 | 0 | 1 | BANKS 1, 3 | a | a | b |
| 1 | 0 | 0 | 0 | BANK 0 | × | c | c |
| 0 | 1 | 0 | 0 | BANK 1 | × | a | c |
| 0 | 0 | 1 | 0 | BANK 2 | × | c | a |
| 0 | 0 | 0 | 1 | BANK 3 | × | a | a |

× : DON'T CARE

REFRESH FOR EACH SINGLE BANK (1)

REFRESH FOR EACH SINGLE BANK (2)

SIMULTANEOUS REFRESH FOR 2 BANKS (1)

SIMULTANEOUS REFRESH FOR 2 BANKS (1)

SIMULTANEOUS REFRESH FOR 4 BANKS (1)

SIMULTANEOUS REFRESH FOR 4 BANKS (1)

SEMICONDUCTOR MEMORY DEVICE AND REFRESH CONTROL METHOD THEREOF

BACKGROUND OF THE INVENTION

1. Field of the Invention

The present invention relates to refresh technique for a semiconductor memory device such as a DRAM (Dynamic Random Access Memory), particularly, a semiconductor memory device having a configuration to perform both an auto refresh in normal operation and a self refresh in standby state, and refresh control method thereof.

2. Description of the Related Art

Recently, reduction in consumption current in standby state is strongly required for a large capacity DRAM mounted on a mobile device. Thus, as an effective scheme for achieving lower power consumption of the DRAM for the mobile devices, partial array self refresh function (hereinafter referred to as "PASR function") is known. This PASR function performs a selective self refresh in which, in a memory cell array which is divided into a plurality of banks, one or some of the banks of the memory cell array are selectively refreshed. In this case, refresh target for retaining data is limited to one or some of the banks, long period refresh operation is performed only for the corresponding banks sequentially. For example, two banks among four banks are designated to be refreshed, refresh area is reduced by half relative to normal refresh. Thus, the employment of the PASR function is effective to reduce consumption current in the DRAM. Various refresh control techniques including the PASR function for selectively performing refresh for a partial area of the memory cell array have been proposed (see Japanese Patent Laid-Open No. Hei 2-192096, Japanese Patent Laid-Open No. 2002-334576, and Japanese Patent Laid-Open No 2004-259343).

However, when the PASR function is employed in the conventional DRAM, a specification is generally used for the purpose of an application in the self refresh, in which banks to be refreshed cannot be designated in the auto refresh in normal operation. In the auto refresh in normal operation, requirement for employing the PASR function in terms of reducing consumption current is not very large compared with the self refresh. However, a use form for limiting a refresh target to part of the banks is assumed for a reason concerning system or process. For example, if a situation arises in which a specific portion of the memory cell array is accessed within a certain time using image data and the like in such a use form, the auto refresh operation is not performed for this specific portion in normal operation, and thereby reducing the number of refresh operations as a whole so as to improve the use efficiency. However, even when the designation of banks based on the PASR function is applied to the auto refresh, portions requiring refresh and other portions not requiring refresh generally do not conform to each other. Thus, it is difficult to achieve an optimum refresh control corresponding to the respective situations of the self refresh and the auto refresh.

Further, although whether or not the refresh operation is performed is set for each bank in the above-mentioned PASR function, a case is assumed in which actually portions requiring refresh and other portions not requiring refresh are actually mixed with each other. In such a case, for example, image data or the like is distributed and stored in respective banks for accessing in a bank interleave mode. If whether or not the refresh operation is performed is set for each bank in this case, it is a problem that the number of banks which can be used decreases and the access efficiency is reduced.

Furthermore, in the conventional PASR function described above, portions to be refreshed can be limited, but a refresh period of each memory cell included in the limited portions is not considered to be selectively set. That is, when the entire number of refresh operations is reduced by limiting the portions to be refreshed, it is not possible to select either of two cases, in one of which the refresh period is maintained while the access efficiency is improved by reducing a refresh busy rate as a whole, and in the other of which the refresh busy rate is maintained while operating margin is improved by shortening the refresh period for the memory cells. Particularly, in the auto refresh, it is required to apply each of the two cases according to the use form. However, it is a problem that the conventional PASR function described above cannot achieve this requirement.

BRIEF SUMMARY OF THE INVENTION

An object of the present invention is to provide a semiconductor memory device and refresh control method thereof, in which a portion to be refreshed can be individually designated corresponding to the respective situations of the self refresh and the auto refresh, and therefore reduction in consumption current and improvement of access efficiency can be both achieved.

An aspect of the present invention is a semiconductor memory device in which refresh operation for a memory cell array including a plurality of memory cells is performed, comprising: refresh control means for switchingly controlling a first refresh mode in which access to the memory cell array from outside is prohibited while retaining data and a second refresh mode in which access to the memory cell array from outside is permitted while retaining data and for performing the refresh operation of the memory cells corresponding to a selected word line; and designating means for individually designating a portion to be refreshed in the first refresh mode and a portion to be refreshed in the second refresh mode, wherein, in controlling the first or second refresh mode, said refresh control means performs the refresh operation when the portion to which the selected word line belongs is designated to be refreshed, and does not perform the refresh operation when the portion to which the selected word line belongs is not designated to be refreshed.

According to the semiconductor memory device of the present invention, each portion to be refreshed is designated for the first and second refresh modes individually, so that partial refresh of the memory cell array can be performed. For example, in a state in which the first refresh mode is a self refresh mode in standby state and the second refresh mode is an auto refresh in normal operation, by individually designating each portion to be refreshed corresponding to the respective situations, the portion to be refreshed can be limited in the self refresh mode for the purpose of reducing consumption current, while the portion to be refreshed can be limited in the auto refresh mode for the purpose of improving access efficiency. In this manner, when switchingly controlling refresh modes having different purposes, different portions from each other are designated for the respective refresh modes, and thereby an optimum refresh control can be achieved.

In this case, portions different from each other can be designated to be refreshed in the respective first and second refresh modes by said designating means.

In the present invention, the memory cell array may be divided into a plurality of banks, and said designating means may selectively designate one or more banks to be refreshed among the plurality of banks and may selectively designate one or more bank inner areas to be refreshed among a plurality of bank inner areas into which the designated bank is divided, regarding the respective first and second refresh modes.

In the present invention, said designating means may store N-bit bank designation data for setting whether or not each of N banks is to be refreshed and M-bit area designation data for setting whether or not each of M areas is to be refreshed, regarding the respective first and second refresh modes.

In this case, said designating means can store the N-bit bank designation data and the M-bit area designation data in a mode register based on input data from outside.

In the present invention, said refresh control means may generate a refresh address corresponding to a row address of the selected word line, a bank selection signal for selecting a bank to which the selected word line belongs, and an area selection signal for selecting an area to which the selected word line belongs respectively, and may supply the generated signals to the memory cell array.

In this case, said refresh control means may perform the refresh operation while sequentially counting the refresh address in the portion to be refreshed, and may not perform the refresh operation while sequentially counting the refresh address in the portion not to be refreshed.

Meanwhile, said refresh control means may perform the refresh operation while sequentially counting the refresh address in the portion to be refreshed, and may shift a refresh position to a subsequent portion to be refreshed without counting the refresh address in the portions not to be refreshed.

In the present invention, said refresh control means can select various controls for N banks. That is, a case of selecting each single bank among N banks and counting the refresh address corresponding to a single selected word line successively, a case of selecting a predetermined number of banks among N banks and counting the refresh address corresponding to each of the predetermined number of selected word lines simultaneously, and a case of selecting all N banks and counting the refresh address corresponding to each of N selected word lines simultaneously.

In the present invention, the first refresh mode may be a self refresh mode in standby state and the second refresh mode may be an auto refresh mode in normal operation, can be selected respectively.

Another object of the present invention is to provide a refresh control method of a semiconductor memory device in which a memory cell array including a plurality of memory cells is provided, comprising the steps of: setting first designation data for designating a portion to be refreshed regarding a first refresh mode in which access to the memory cell array from outside is prohibited while retaining data; setting second designation data for designating a portion to be refreshed regarding a second refresh mode in which access to the memory cell array from outside is permitted while retaining data; controlling so that the first refresh mode is set, and based on the first designation data, the refresh operation is performed when a portion to which a selected word line belongs is designated to be refreshed, while the refresh operation is not performed when a portion to which the selected word line belongs is not designated to be refreshed; and controlling so that the second refresh mode is set, and based on the second designation data, the refresh operation is performed when a portion to which the selected word line belongs is designated to be refreshed, while the refresh operation is not performed when a portion to which the selected word line belongs is not designated to be refreshed.

In the method of the present invention, the first designation data and the second designation data may be data for designating portions different from each other to be refreshed in the memory cell array.

In the method of the present invention, the first designation data and the second designation data may be data for designating the same portion as each other to be refreshed in the memory cell array.

In the method of the present invention, the first designation data and the second designation data may include bank designation data for selectively designating one or more banks to be refreshed among a plurality of banks into which the memory cell array is divided, and area designation data for selectively designating one or more bank inner areas to be refreshed among a plurality of bank inner areas into which the designated bank is divided, regarding the respective first and second refresh modes In the method of the present invention, each of the plurality of the banks may have the same size, and each of the plurality of bank inner areas may be an area having the same size and successive row addresses in each bank.

In the method of the present invention, when the total number of the selected word lines included in the portion to be refreshed decreases in the entire memory cell array, various control can be applied. That is, a case in which an average frequency of the refresh operations is reduced while a refresh period of each memory cell is maintained, or a case in which an average frequency of the refresh operations is maintained while a refresh period of each memory cell is reduced, can be applied respectively.

As described above, according to the present invention, in the self refresh and the auto refresh in the semiconductor device, respective portions to be refreshed can be designated individually, and the designated portions can be selectively refreshed. Therefore, reduction in consumption current in standby state and improvement of access efficiency can be both achieved. For example, for image data or the like which is periodically accessed, the auto refresh is not performed while only the self refresh is performed, so that flexible refresh according to the use form can be realized.

Further, whether or not the refresh operation is performed can be set, not only for each bank, but also for the bank inner areas into which the bank is divided, and thus efficiency when accessing in a bank interleave mode can be improved. Furthermore, when the number of refresh operations decreases as a whole due to limiting the portions to be refreshed, a case of reducing a refresh busy rate and a case of shortening a refresh period can be selectively used, and it is possible to flexibly cope with both cases of giving priority to access efficiency and operating margin.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 3 is a table showing designation data in the mode register corresponding to 16 different setting examples of the refresh control;

FIG. 4A is a diagram showing a first setting example of the refresh control;

FIG. 4B is a diagram showing a second setting example of the refresh control;

FIG. 6A is a diagram showing a fifth setting example of the refresh control;

FIG. 6B is a diagram showing a sixth setting example of the refresh control;

FIG. 7A is a diagram showing a seventh setting example of the refresh control;

FIG. 7B is a diagram showing an eighth setting example of the refresh control;

FIG. 8A is a diagram showing a ninth setting example of the refresh control;

FIG. 8B is a diagram showing a tenth setting example of the refresh control;

FIG. 9A is a diagram showing an eleventh setting example of the refresh control;

FIG. 9B is a diagram showing a twelfth setting example of the refresh control;

FIG. 10A is a diagram showing a thirteenth setting example of the refresh control;

FIG. 10B is a diagram showing a fourteenth setting example of the refresh control;

FIG. 11A is a diagram showing a fifteenth setting example of the refresh control;

FIG. 11B is a diagram showing a sixteenth setting example of the refresh control;

FIG. 21 is a diagram showing a relation between control states of switches 201 to 203 of FIGS. 20A and 20B and settings for the refresh operation;

FIG. 23 is a diagram showing a relation between control states of switches 204 to 206 of FIGS. 22A and 22B and settings for the refresh operation;

DETAILED DESCRIPTION OF THE INVENTION

Preferred embodiments of the present invention will be described below with reference to accompanying drawings. In the embodiments, the present invention is applied to a DRAM having a configuration capable of performing an auto refresh in normal operation and a self refresh in standby state. In the following, two embodiments having different configurations and operations will be described.

First Embodiment

Figure 1:
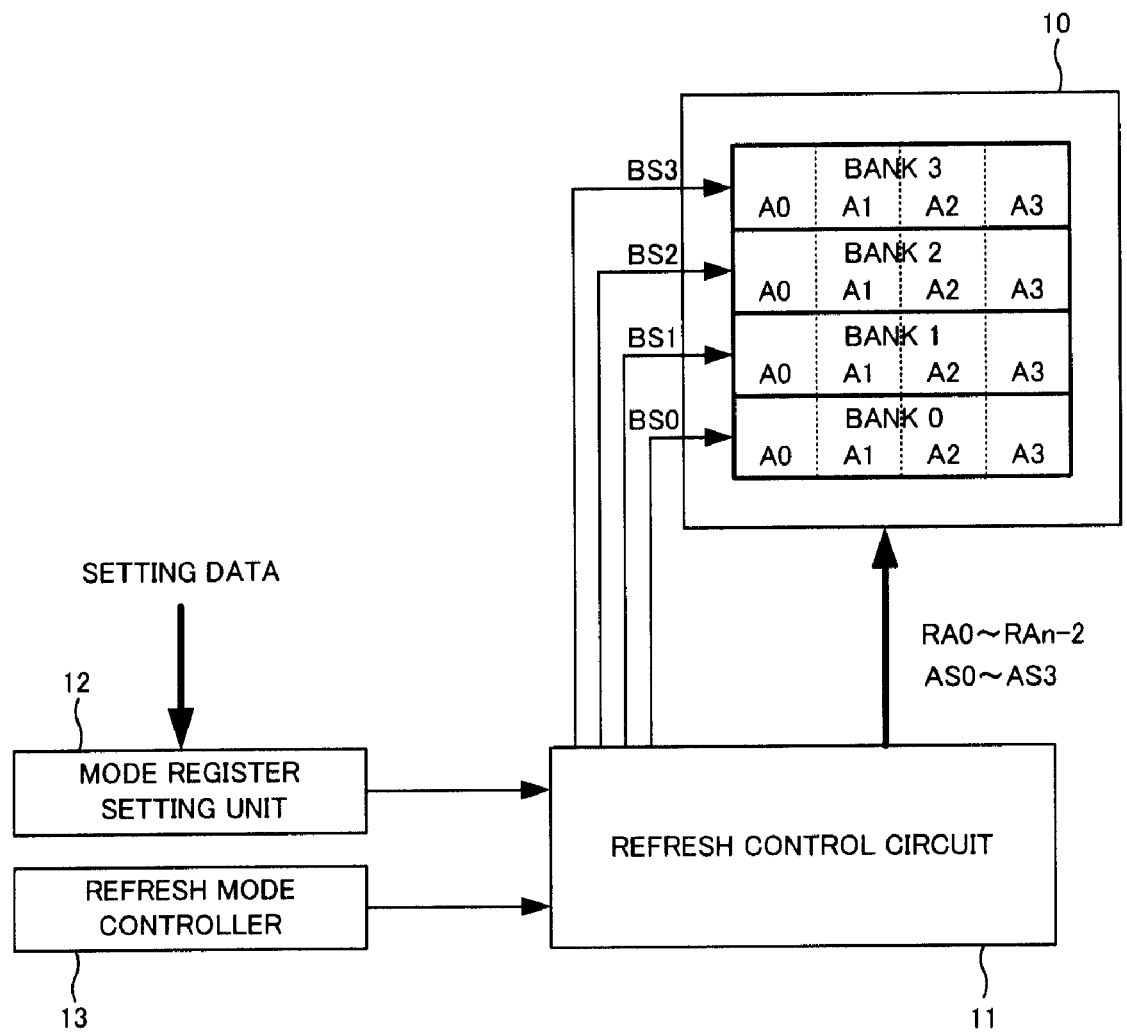
FIG. 1 a block diagram showing an essential configuration concerning refresh control in a DRAM of a first embodiment.

FIG. 1 is a block diagram showing an essential configuration concerning refresh control in a DRAM of a first embodiment. The DRAM shown in FIG. 1 includes a memory cell array 10 having a plurality of memory cells formed at intersections of a plurality of word lines and a plurality of bit lines. The memory cell array 10 is divided into four banks (these banks are shown as banks 0, 1, 2 and 3 in the drawings). These banks have the same storage capacity and configuration. When reading from or writing to the memory cell array 10, a desired bank can be selectively accessed.

Each of Four banks 0 to 3 is divided into four bank inner areas (hereinafter referred to simply as "areas") A0, A1, A2 and A3. These areas A0 to A3 is set to have the same size, and when a predetermined bank is refreshed, a desired area of the areas A0 to A3 can be selectively designated to be refreshed under the control described later.

A refresh control circuit 11 is a circuit for controlling refresh operation for the memory cell array 10. The refresh control circuit 11 includes a counter circuit for sequentially generating a refresh address corresponding to a row address of a selected word line to be refreshed in the memory cell array 10, and later described various decoders for generating signals for controlling the refresh operation. The refresh control circuit 11 functions the refresh control means of the invention in cooperation with a refresh mode controller 13 described later.

The DRAM of the first embodiment has two refresh modes, one of which is a self refresh mode (first refresh mode of the invention) for performing the self refresh in which access from outside is prohibited while retaining data in standby state, and the other of which is an auto refresh mode (second refresh mode of the invention) for performing the auto refresh in which access from outside is permitted while retaining data in normal operation. The above-mentioned refresh control circuit 11 is a circuit used in controls for both the self refresh mode and the auto refresh mode.

As shown in FIG. 1, the refresh control circuit 11 generates 4-bit bank selection signals BS0, BS1, BS2, BS3, (n−1) bit refresh address RA0 to RAn−2, and 4-bit area selection signals AS0, AS1, AS2, AS3, respectively. The bank selection signals BS0 to BS3 are signals for selecting a bank to which a selected word line belongs in the refresh operation, The area selection signals AS0 to AS3 are signals for selecting one or more areas A0 to A3 to which the selected word line belongs, since each bank is divided into four areas A0 to A3. The refresh address RA0 to RAn−2 is used to count up a row address of the selected word line in a selected bank and in a selected area in the refresh operation. In order to count the entire single bank, (n+1) bit refresh address is essentially assumed. However, since each bank is divided into the four areas A0 to A3 in the first embodiment, the refresh address is reduced by 2 bits.

A mode register setting unit 12 stores designation data for refresh in the mode register based on setting data input from outside, and functions as the designation means of the invention. The designation data regarding the self refresh (first designation data) and the designation data regarding the auto refresh (second designation data) can be individually set for the mode register setting unit 12. Banks 0 to 3 and areas A0 to A3 can be selectively designated to be refreshed by the mode register setting unit 12. Specific content of the designation data stored in the mode register will be described later.

The refresh mode controller 13 is selectively controls the above-mentioned two refresh modes, and sends a selection signal of the refresh mode to the refresh control circuit 11. Also, the refresh mode controller 13 sends a refresh start signal of the auto refresh to the refresh control circuit 11 based on a refresh request from outside. In addition, the self refresh is started at a predetermined timing based on an internal timer of the DRAM.

Figure 2:
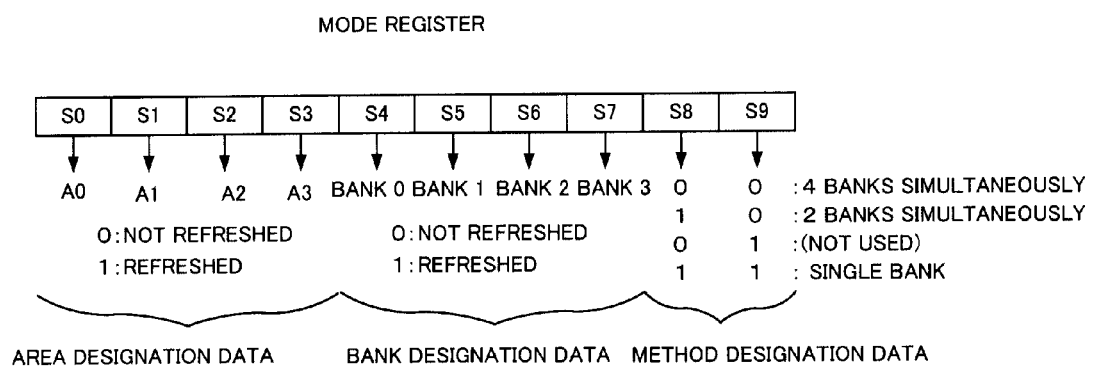
FIG. 2 is a diagram showing a data configuration of a mode register set by a mode register setting unit.

FIG. 2 is a diagram showing a data configuration of the mode register in which the designation data is stored by the mode register setting unit 12. In an example of FIG. 2, in the mode register composed of 10 bits in total, bits S0 to S3 are assigned to area designation data, bits S4 to S7 are assigned to bank designation data, and bits S8 and S9 are assigned to method designation data. Besides, since mode registers are used separately for the self refresh and the auto refresh, two mode registers of FIG. 2 are provided, so that the designation data of 20 bits in total is stored therein.

The area designation data is used for setting whether or not the refresh operation is performed for the areas A1, A1, A2 and A3 of each bank, in the order of bits S0, S1, S2 and S3. When any of the bits S0 to S3 is set to 1, a corresponding area among the areas A0 to A3 is designated to be refreshed, and when any of the bits S0 to S3 is set to 0, a corresponding area among the areas A0 to A3 is not designated to be refreshed.

The bank designation data is used for setting whether or not the refresh operation is performed for the banks 0, 1, 2 and 3, in the order of bits S4, S5, S6 and S7. When any of the bits S4 to S7 is set to 1, a corresponding bank is designated to be refreshed, and when any of the bits S4 to S7 is set to 0, a corresponding bank is not designated to be refreshed.

The method designation data is used for setting the refresh timing of each bank based on a pattern of the bits S8 and S9. That is, it can be selected by the method designation data whether refresh operations for the banks are performed at the same timing or at different timings, as described later. When the bits S8 and S9 are both set to 0, the refresh operation is performed for each of all the four banks at the same timing. When the bit S8 is set to 1 and the bit S9 is set to 0, the refresh operation is performed for each of two banks among the four banks at the same timing. When the bits S8 and S9 are both set to 1, the refresh operation is performed for each bank. Besides, a setting in which the bit S8 is 0 and the bit S9 is 1 is not used.

In the first embodiment, it is a feature that the self refresh and the auto refresh can be used separately in different conditions according to respective situations by using the designation data stored in the mode register. In the following, a plurality of setting examples in which the self refresh and the auto refresh are assumed to be used separately will be specifically described with reference to FIGS. 3 to 11.

In a table of FIG. 3, designation data in the mode register corresponding to 16 different setting examples of refresh are shown. In FIG. 3, regarding the self refresh and the auto refresh, patterns of four bits S0 to S3 of the area designation data and four bits S4 to S7 of the bank designation data are shown. Herein, the method designation data in the mode register is not considered. FIGS. 4 to 11 show states of the banks 0 to 3 and the areas A0 to A3 in the self refresh and the auto refresh corresponding to first to sixteenth setting examples. In FIGS. 4 to FIG. 11, portions to be refreshed (shaded portions in FIGS.) and portions not to be refreshed (void portions in FIGS.) are represented distinctively in response to whether or not each portion is a refresh target.

FIGS. 4A and 4B show a case in which all banks are refreshed in the self refresh, while banks to be refreshed are limited in the auto refresh. Here, all the areas A0 to A3 are designated to be refreshed in the self refresh and the auto refresh. First, in a first setting example shown in FIG. 4A, all banks are designated to be refreshed in the self refresh, while banks 0 and 1 are designated to be refreshed in the auto refresh. Meanwhile, in a second setting example shown in FIG. 4B, all banks are designated to be refreshed in the self refresh, while only the bank 0 is designated to be refreshed in the auto refresh.

Figure 5A:
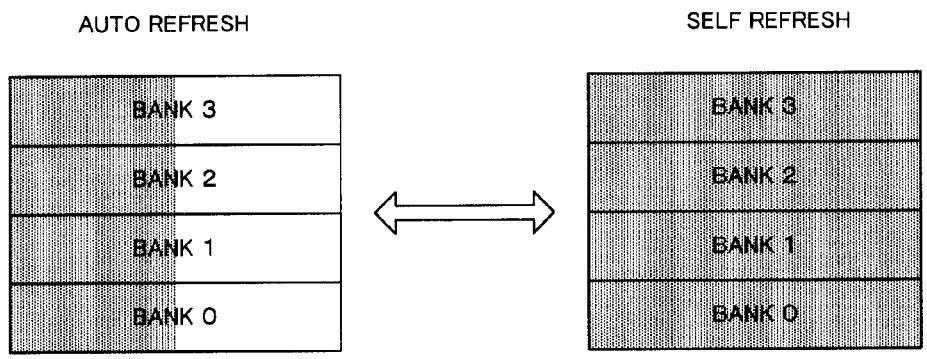
FIG. 5A is a diagram showing a third setting example of the refresh control.
Figure 5B:
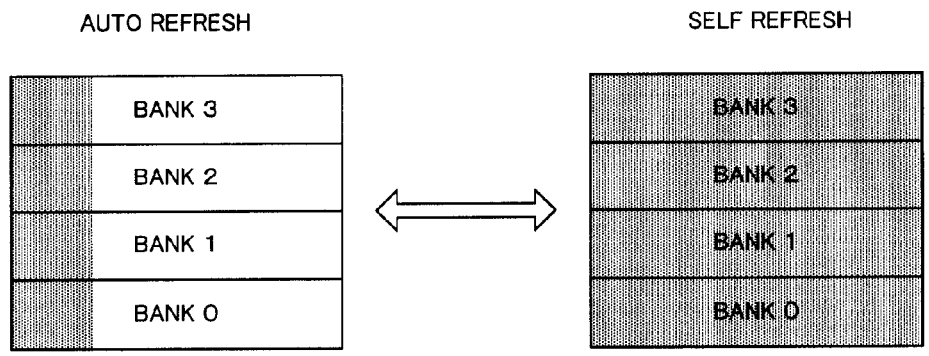
FIG. 5B is a diagram showing a fourth setting example of the refresh control.
Figure 12:
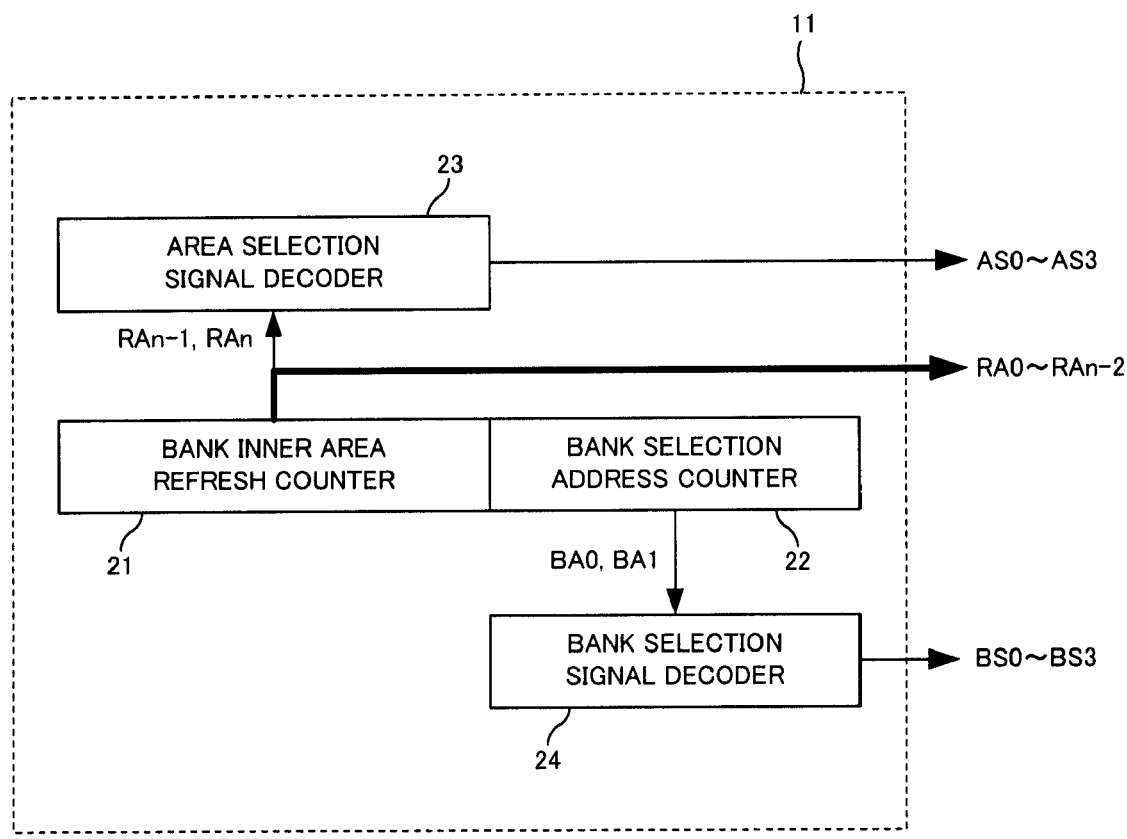
FIG. 12 is a diagram showing a configuration of a refresh control circuit in the first embodiment.

FIGS. 5A and 5B show a case in which all areas in each bank are refreshed in the self refresh, while areas to be refreshed are limited in the auto refresh. Here, all the banks 0 to 3 are designated to be refreshed in the self refresh and the auto refresh. First, in a third setting example shown in FIG. 5A, all areas are designated to be refreshed in the self refresh, while areas A0 and A1 are designated to be refreshed in the auto refresh. Meanwhile, in a fourth setting example shown in FIG. 5B, all areas are designated to be refreshed in the self refresh, while only the area A0 is designated to be refreshed in the auto refresh.

According to the setting examples of FIGS. 4A, 4B, 5A and 5B, in the auto refresh, image data or the like for which refresh is not required in normal operation can be stored in some portion not to be refreshed, while the other portion to be refreshed can be used as a work area for application software. Generally, the auto refresh can be omitted for data such as image data which is accessed periodically. Meanwhile, in the self refresh, the entire memory cell array 10 is refreshed so as to retain all the data, and the original state can be restored after returning from the self refresh.

FIGS. 6A and 6B show a case in which different banks from each other are designated to be refreshed in the self refresh and the auto refresh. Here, all the areas A0 to A3 are designated to be refreshed in the self refresh and the auto refresh. First, in a fifth setting example shown in FIG. 6A, banks 2 and 3 are designated to be refreshed in the self refresh, while banks 0 and 1 are designated to be refreshed in the auto refresh. Meanwhile, in a sixth setting example shown in FIG. 6B, banks 1, 2, 3 are designated to be refreshed in the self refresh, while only the bank 0 is designated to be refreshed in the auto refresh.

FIGS. 7A and 7B show a case in which different areas from each other are designated to be refreshed in the self refresh and the auto refresh. Here, all the banks 0 to 3 are designated to be refreshed in the self refresh and the auto refresh. First, in a seventh setting example shown in FIG. 7A, areas A2 and A3 are designated to be refreshed in the self refresh, while areas A0 and A1 are designated to be refreshed in the auto refresh. Meanwhile, in an eighth setting example shown in FIG. 7B, areas A1, A2 and A3 are designated to be refreshed in the self refresh, while only the area A0 is designated to be refreshed in the auto refresh.

According to the setting examples of FIGS. 6A, 6B, 7A and 7B, if image data is stored in some portion of the memory cell array 10, the auto refresh is not required for this portion, while other portions can be used as a work area for application software. On the contrary, in the self refresh, image data or the like required to be retained should be selectively refreshed. Thus, after returning from the self refresh, the application software should be re-executed, but the original image data can be immediately displayed.

FIGS. 8A and 8B show a case in which the same banks are designated to be refreshed in the self refresh and the auto refresh. Here, all the areas A0 to A3 are designated to be refreshed in the self refresh and the auto refresh. First, in a ninth setting example shown in FIG. 8A, banks 0 and 1 are designated to be refreshed both in the self refresh and the auto refresh. Meanwhile, in a tenth setting example shown in FIG. 8B, only the bank 0 is designated to be refreshed both in the self refresh and the auto refresh.

FIGS. 9A and 9B show a case in which the same areas in each bank are designated to be refreshed in the self refresh and the auto refresh. Here, all the banks 0 to 3 are designated to be refreshed in the self refresh and the auto refresh. First, in an eleventh setting example shown in FIG. 9A, areas A0 and A1 are designated to be refreshed both in the self refresh and the auto refresh. Meanwhile, in a twelfth setting example shown in FIG. 9B, only the area A0 is designated to be refreshed both in the self refresh and the auto refresh.

According to the setting examples of FIGS. 8A, 8B, 9A and 9B, if image data or the like is stored in some portion of the memory cell array 10, the auto refresh is not required for this portion, while other portions can be used as a work area for application software. On the contrary, in the self refresh, it is assumed that the refresh operation is not performed for image data which is not required to be retained, while the refresh operation is performed for data in the work area. Thus, after returning from the self refresh, image data should be newly generated, but the application software can immediately continue to operate.

FIGS. 10A and 10B show a case in which different areas of the same banks are designated to be refreshed in the self refresh and the auto refresh. First, in a thirteenth setting example shown in FIG. 10A, banks 0 and 1 are designated to be refreshed both in the self refresh and the auto refresh. However, areas A0 and A1 are designated to be refreshed in the self refresh, while all areas are designated to be refreshed in the auto refresh. Meanwhile, in a fourteenth setting example shown in FIG. 10B, the bank 0 is designated to be refreshed both in the self refresh and the auto refresh. However, areas A0 and A1 are designated to be refreshed in the self refresh, while all areas are designated to be refreshed in the auto refresh.

FIGS. 11A and 11B show a case in which the same areas of different banks are designated to be refreshed in the self refresh and the auto refresh. First, in a fifteenth setting example shown in FIG. 11A, banks 0 and 1 are designated to be refreshed in the self refresh, while all banks are designated to be refreshed in the auto refresh. However, areas A0 and A1 are designated to be refreshed both in the self refresh and the auto refresh. Meanwhile, in a sixteenth setting example shown in FIG. 11B, banks 0 and 1 are designated to be refreshed in the self refresh, while all banks are designated to be refreshed in the auto refresh. However, only the area A0 is designated to be refreshed both in the self refresh and the auto refresh.

According to the setting examples of FIGS. 10A, 10B, 11A and 11B, if image data or the like is stored in a predetermined bank or area, the auto refresh is not required for this portion, while other portions can be used as a work area for application software. On the contrary, in the self refresh, the refresh operation is not performed for image data which is not required to be retained, while the refresh operation is selectively performed for part of data required to be retained in the work area. Thus, after returning from the self refresh, image data should be newly generated, but the application software can immediately continue to operate by retaining data required in returning.

Next, a configuration of the refresh control circuit 11 will be described with reference to FIGS. 12 to 15. As shown in a block diagram of FIG. 12, the refresh control circuit 11 of the first embodiment includes a bank inner area refresh counter 21, a bank selection address counter 22, an area selection signal decoder 23 and a bank selection signal decoder 24.

Figure 13A:
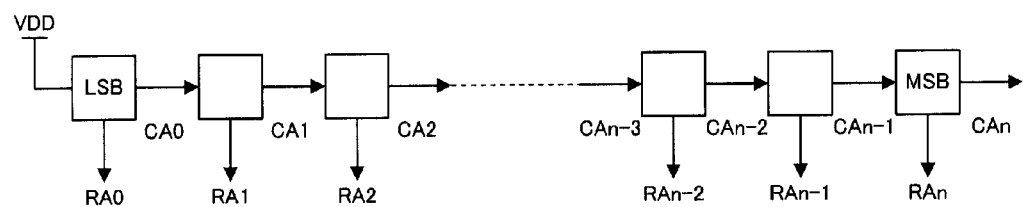
FIG. 13A is a diagram showing a configuration of a bank inner area refresh counter of FIG. 12.
Figure 13B:
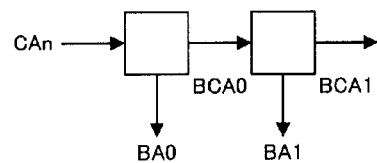
FIG. 13B is a diagram showing a configuration of a bank selection address counter of FIG. 12.

FIG. 13A shows a configuration of the bank inner area refresh counter 21, and FIG. 13B shows a configuration of the bank selection address counter 22. As shown in FIG. 13A, the bank inner area refresh counter 21 is a counter which outputs a refresh address RA0 to RAn as a count value corresponding to a row address of the areas A0 to A3 of each bank and counts up every time refresh is started. An (n+1) stage binary counter circuit is configured from a first stage corresponding to a least significant bit outputting the bit RA0 to a last stage corresponding to a most significant bit outputting the bit RAn through n−1 stages outputting the bits RA1 to RAn−1. Further, carries CA0 to CAn generated by the count operation of the binary counter circuit are sequentially transferred to each subsequent stage.

Meanwhile, as shown in FIG. 13B, the bank selection address counter 22 is a counter which outputs 2-bit bank selection address BA0 and BA1 as a count value. A two stage binary counter circuit is configured with a first stage inputting the carry CAn from the last stage of the bank inner area refresh counter 21 and outputting the bit BA0, and a last stage outputting the bit BA1. Further, carries BCA0 and BCA1 generated by the count operation of the binary counter circuit are sequentially transferred to each subsequent stage.

Figure 14:
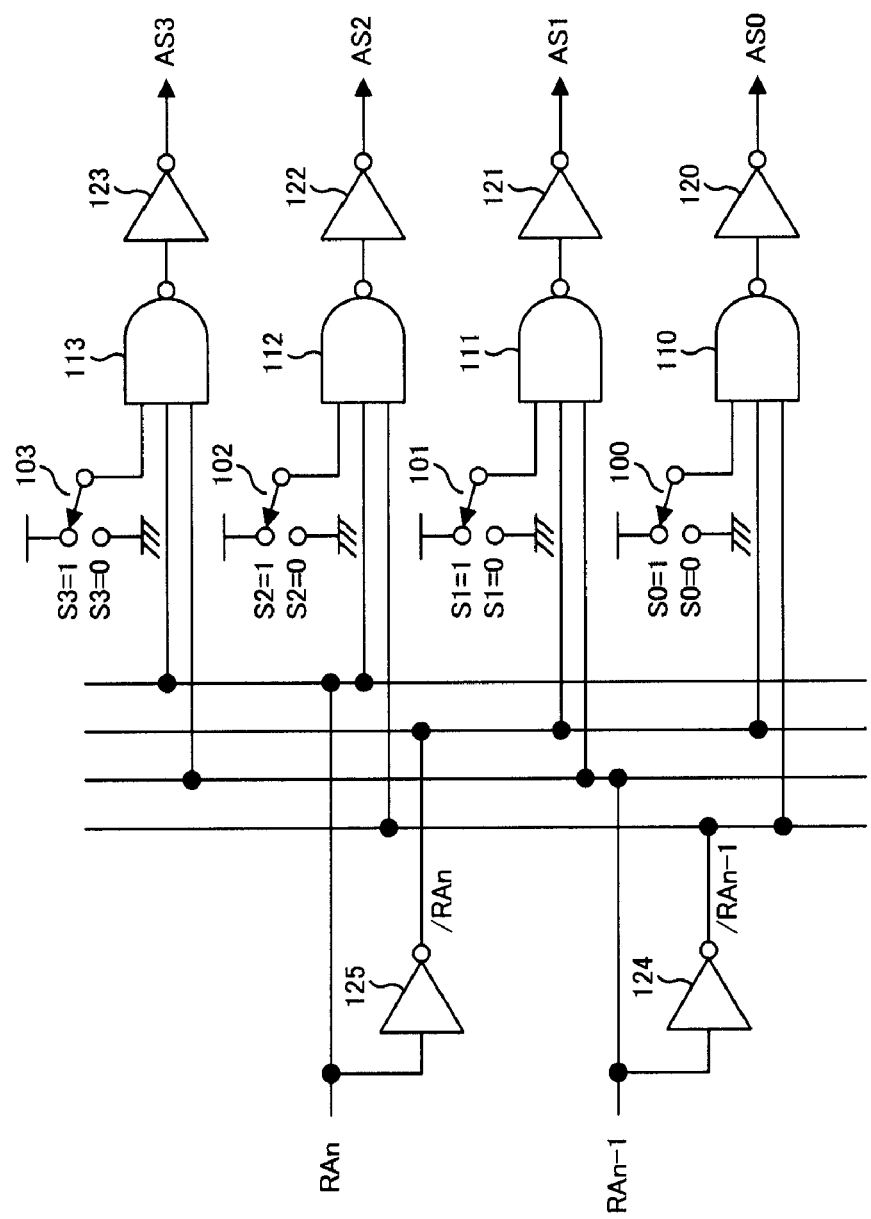
FIG. 14 is a diagram showing a configuration of an area selection signal decoder of FIG. 12.

FIG. 14 shows a configuration of the area selection signal decoder 23. As shown in FIG. 14, the area selection signal decoder 23 includes four switches 100 to 103, four NAND gates 110 to 113 and six inverters 120 to 125. Upper two bits RAn−1 and RAn of the refresh address output from the bank inner area refresh counter 21 is input to the area selection signal decoder 23, and the 4-bit area selection signals AS0 to AS3 are output from the area selection signal decoder 23.

The switches 100 to 103 are switchingly controlled to be high or low in response to the bits S0 to S3 of the area designation data in the mode register. For example, the switch 100 is set to high when S0=1, and set to low when S0=0, based on the bit S0 corresponding to the area A0. The other switches 101 to 103 are controlled in the same manner, based on the bits S1 to S3. The example of FIG. 14 corresponds to a setting in which all the bits S0 to S3 are 1, and thus all the four switches 100 to 103 are set to high, in order to refresh all the areas A0 to A3.

An output of 1 bit from each of the switches 100 to 103 is input to each of the NAND gates 110 to 113. Predetermined two bits among bits RAn−1, RAn or inverted bits /RAn−1, /RAn passing through inverters 124 and 125 are also input to each of the NAND gates 110 to 113. In the example of FIG. 14, the output from the switch 100, the inverted bits /RAn−1 and /RAn are input to the NAND gate 110. The output from the switch 101, the bit RAn−1 and the inverted bit /RAn are input to the NAND gate 111. The output from the switch 102, the inverted bit /RAn−1 and the bit RAn are input to the NAND gate 112. The output from the switch 103, the bits RAn−1 and RAn are input to the NAND gate 113.

Outputs from the NAND gates 110 to 113 are inverted by the inverters 120 to 123, and thereafter output as the 4-bit area selection signals AS0 to AS3. In the example of FIG. 14, one of the area selection signals AS0 to AS3 is set to 1, and the other three are set to 0 in response to a pattern of the upper two bits RAn−1 and RAn of the refresh address. Specifically, the bit AS0 is set to 1 when RAn−1=RAn=0, the bit AS1 is set to 1 when RAn−1=1 and RAn=0, the bit AS2 is set to 1 when RAn−1=0 and RAn=1, and the bit AS3 is set to 1 when RAn−1=RAn=1. That is, as the bank inner area refresh counter 21 counts up, each of the area selection signals AS0, AS1, AS2 and AS3 changes to 1 in this order for a certain period of time. However, when any of the switches 100 to 103 is set to low, corresponding area selection signals AS0 to AS3 remain in a state of 0.

Figure 15:
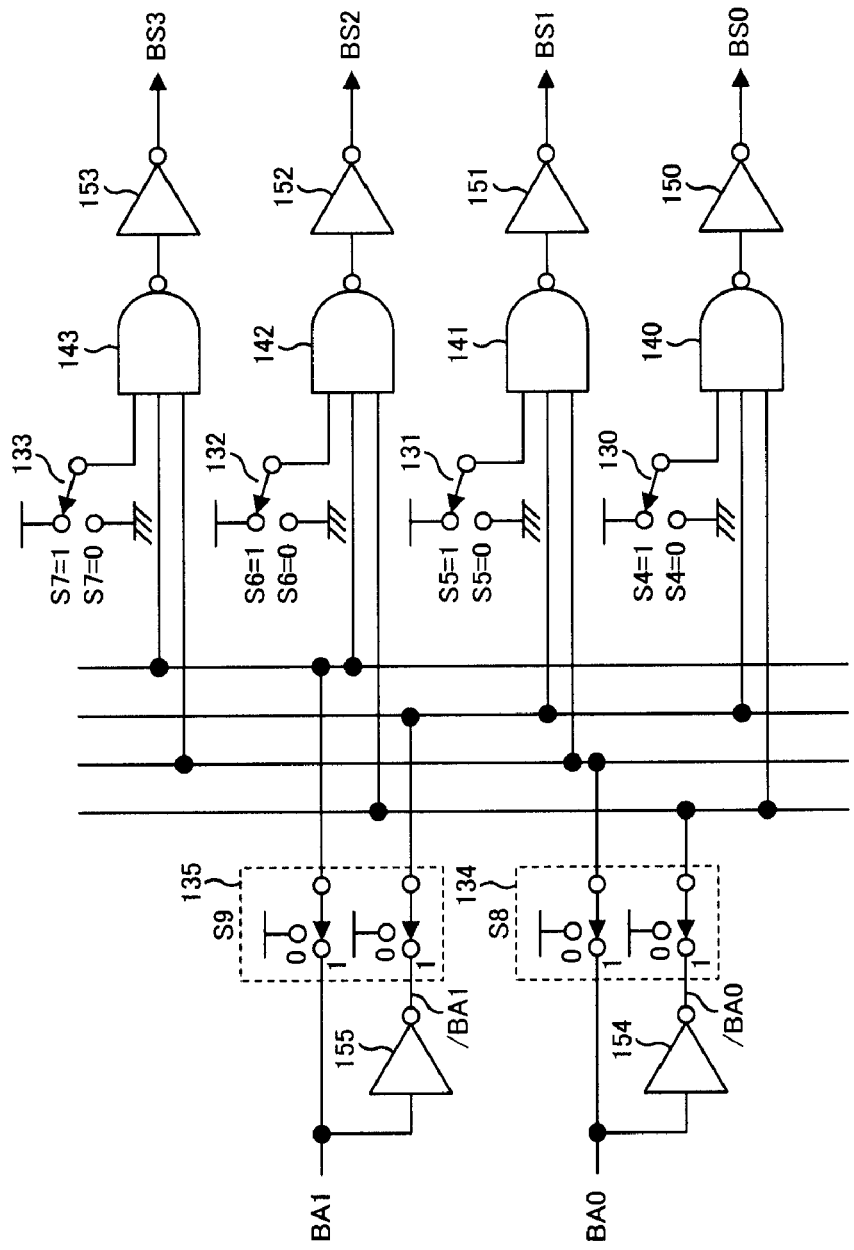
FIG. 15 is a diagram showing a configuration of a bank selection signal decoder of FIG. 12.

FIG. 15 shows a configuration of the bank selection signal decoder 24. As shown in FIG. 15, the bank selection signal decoder 24 includes six switches 130 to 135, four NAND gates 140 to 143 and six inverters 150 to 155. The bank selection address BA0 and BA1 output from the bank selection address counter 22 is input to the bank selection signal decoder 24, and the 4-bit bank selection signals BS0 to BS3 are output.

In FIG. 15, connection relation of the four switches 130 to 133, the four NAND gates 140 to 143 and the four inverters 150 to 153 is common to that in FIG. 14. In this case, the switches 130 to 133 are switchingly controlled to be high or low in response to the bits S4 to S7 of the bank designation data in the mode register. The example of FIG. 15 corresponds to a setting in which all the bits S4 to S7 are 1, and thus all the four switches 130 to 133 are set to high, in order to refresh all the banks.

On the other hand, the switches 134 and 135 are switchingly controlled to be high or low in response to the bits S8 and S9 of the method designation data in the mode register. When S8=S9=1 is set to designate refresh for each single bank, the switch 134 is controlled so that the bit BA0 of the bank selection address and the inverted bit /BA0 through the inverter 154 are output, and the switch 135 is controlled so that the bit BA1 of the bank selection address and the inverted /BA1 through the inverter 155 are output. When S8=1, S9=0 is set to designate simultaneous refresh for two banks, the switch 134 is control in the same manner as described above, while the switch 135 is controlled so that both outputs thereof go high. Further, when S8=S9=0 is set to designate simultaneous refresh for four banks, the switches 134 and 135 are controlled so that both outputs thereof go high.

Changes in the bank selection address counter 22 counting up in a state in which the bits S4 to S7 are 1 as in the example of FIG. 15 according to the above described control of the switches 134 and 135 will be considered. When the refresh for each single bank is designated, each of the bank selection signals BS0, BS1, BS2 and BS3 changes to 1 in this order for a certain period of time. When the simultaneous refresh for two banks is designated, the bank selection signals BS0 and BS2 change to 1 for a certain period of time, and thereafter the bank selection signals BS1 and BS3 change to 1 for a certain period of time. When the simultaneous refresh for four banks is designated, the bank selection signals BS0 to BS3 change to 1 simultaneously and this state is maintained for a certain period of time.

Next, refresh operation of the first embodiment will be described with reference to FIGS. 16A to 18B. The following description is common to both the self refresh operation performed in the self refresh mode and the auto refresh operation performed in the auto refresh mode.

Figure 16A:
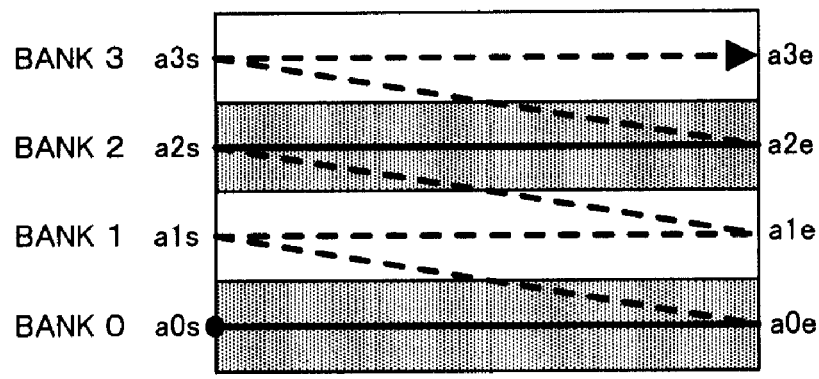
FIGS. 16A and 16B are diagrams showing operation of the first embodiment when the refresh for each single bank is designated.
Figure 16B:
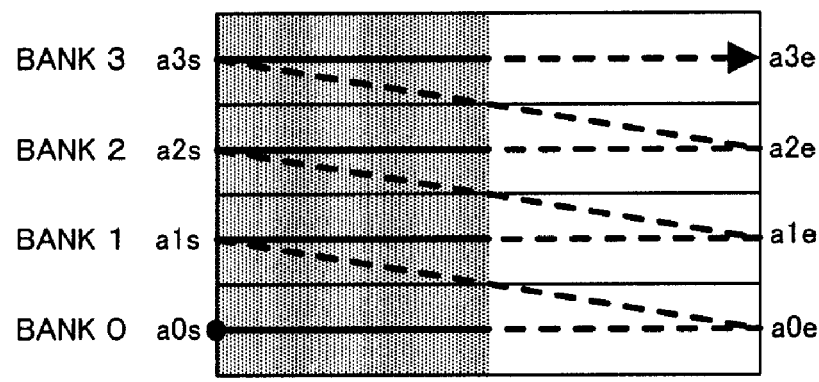

Operation of the first embodiment when the refresh for each single bank is designated will be described with reference to FIGS. 16A and 16B. FIG. 16A shows an operation in which all the areas A0 to A3 in two banks 0 and 2 are designated to be refreshed and the bits S0 to S9 in the mode register correspond to a pattern of "1111101011". FIG. 16B shows an operation in which the areas A0 and A1 in all the banks (half of each bank) are designated to be refreshed, and the bits S0 to S9 in the mode register correspond to a pattern of "1100111111".

The refresh operation based on the setting of FIG. 16A is started from a first position a0s of the bank 0, and as the refresh address is counted up, a corresponding refresh operation for a selected word line is performed. When the refresh position reaches a last position a0e of the bank 0, it is shifted to a first position a1s of the bank 1. At this point, since the bank 1 is not to be refreshed, the count up operation is only performed, while the corresponding refresh operation for the selected word line is not performed. When the refresh position reaches a last position a1e of the bank 1, it is shifted to a first position a2s of the bank 2, and the same control as for the banks 0 and 1 is performed subsequently. In this manner, the count-up operation is performed regardless of whether or not each target bank is to be refreshed, but performing of the refresh operation is controlled in response to the setting of the mode register.

The refresh operation based on the setting of FIG. 16B is started from the first position a0s of the bank 0. The count up operation for the areas A0 and A1 is performed in the same manner described above, and a corresponding refresh operation for a selected word line is performed. However, after reaching a midpoint position in each bank, the count-up operation is only performed, while the corresponding refresh operation is not performed. When the refresh position reaches the last position a0e of the bank 0, it is shifted to the first position a1s of the bank 1, and the same control as for the bank 0 is performed subsequently. Thereafter, the same control is performed for the banks 2 and 3. Herein, the count-up operation is performed in the same manner as in FIG. 16A, but the refresh operation for each bank is switched at different timings.

Figure 17A:
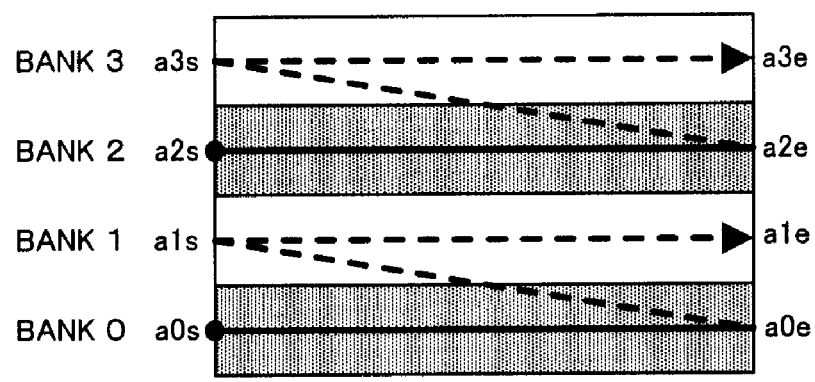
FIGS. 17A and 17B are diagrams showing operation of the first embodiment when the simultaneous refresh for two banks is designated.
Figure 17B:
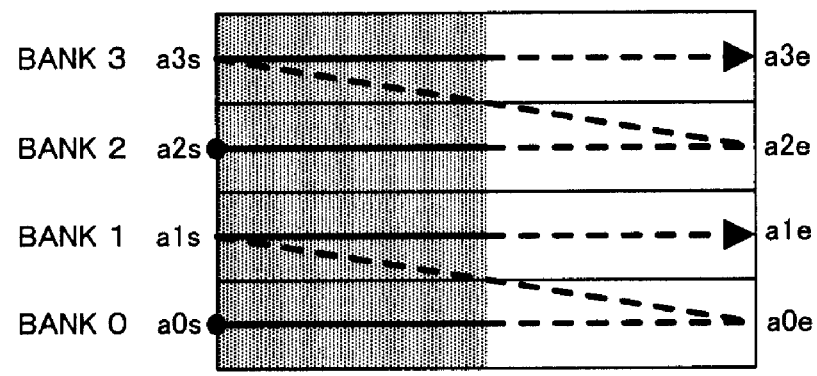

Operation of the first embodiment when the simultaneous refresh for two banks is designated will be described with reference to FIGS. 17A and 17B. Designations of the banks and the areas of FIGS. 17A and 17B are the same as those of FIGS. 16A and 16B respectively. The bits S0 to S9 in the mode register correspond to a pattern of "1111101010" in FIG. 17A, and correspond to a pattern of "1100111110" in FIG. 17B.

The refresh operation based on the setting of FIG. 17A is started from first positions a0s and a2s of the banks 0 and 2, and as the refresh address is counted up, a corresponding refresh operation for each of two selected word lines is performed. When the respective refresh positions reach last positions a0e and a2e of the banks 0 and 2, they are simultaneously shifted to first positions a1s and a3s of the banks 1 and 3. At this point, since the banks 1 and 3 are not to be refreshed, the count-up operations are only performed, while the corresponding refresh operations for the two selected word lines are not performed. Thereafter, when the refresh positions simultaneously reach last position a1e and a3e of the bank 1 and 3, control is finished. In this manner, by comparing FIG. 17A with FIG. 16.A, if the count-up operations of the refresh address are controlled at the same timings, the entire memory cell array 10 can be refreshed with half the number of refresh operations.

The refresh operation based on the setting of FIG. 17B is started from the first positions a0s and a2s of the banks 0 and 2 simultaneously as the same in FIG. 17A. As the count up operation is performed, the corresponding refresh operation for each of two selected word lines is performed. Then, after reaching the midpoint position in each bank, the corresponding refresh operation is not performed. When the refresh positions reach the last positions a0e and a2e of the banks 0 and 2 simultaneously, they are simultaneously shifted to the first positions a1s and a3s of the banks 1 and 3. Thereafter, control is performed for the banks 1 and 3 in the same manner as for the banks 0 and 2. Herein, the count-up operation is performed in the same manner as in FIG. 17A, but the refresh operation for each bank is switched at the same timings as in FIG. 16B.

Figure 18A:
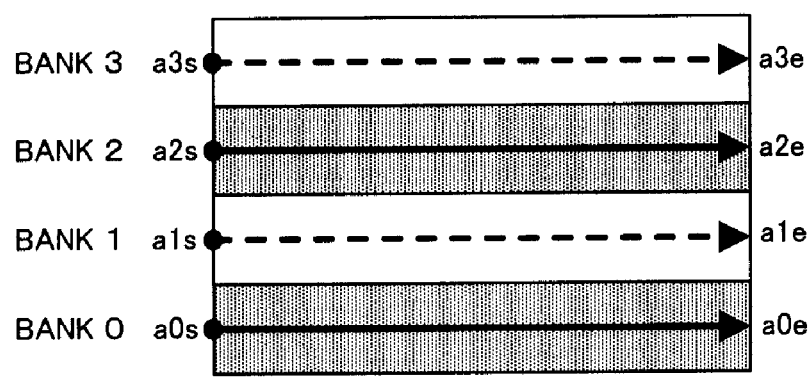
FIGS. 18A and 18B are diagrams showing operation of the first embodiment when the simultaneous refresh for four banks is designated.
Figure 18B:
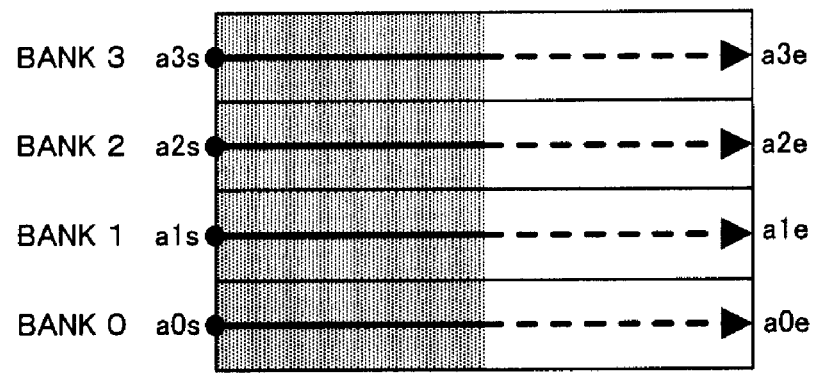
Figure 19:
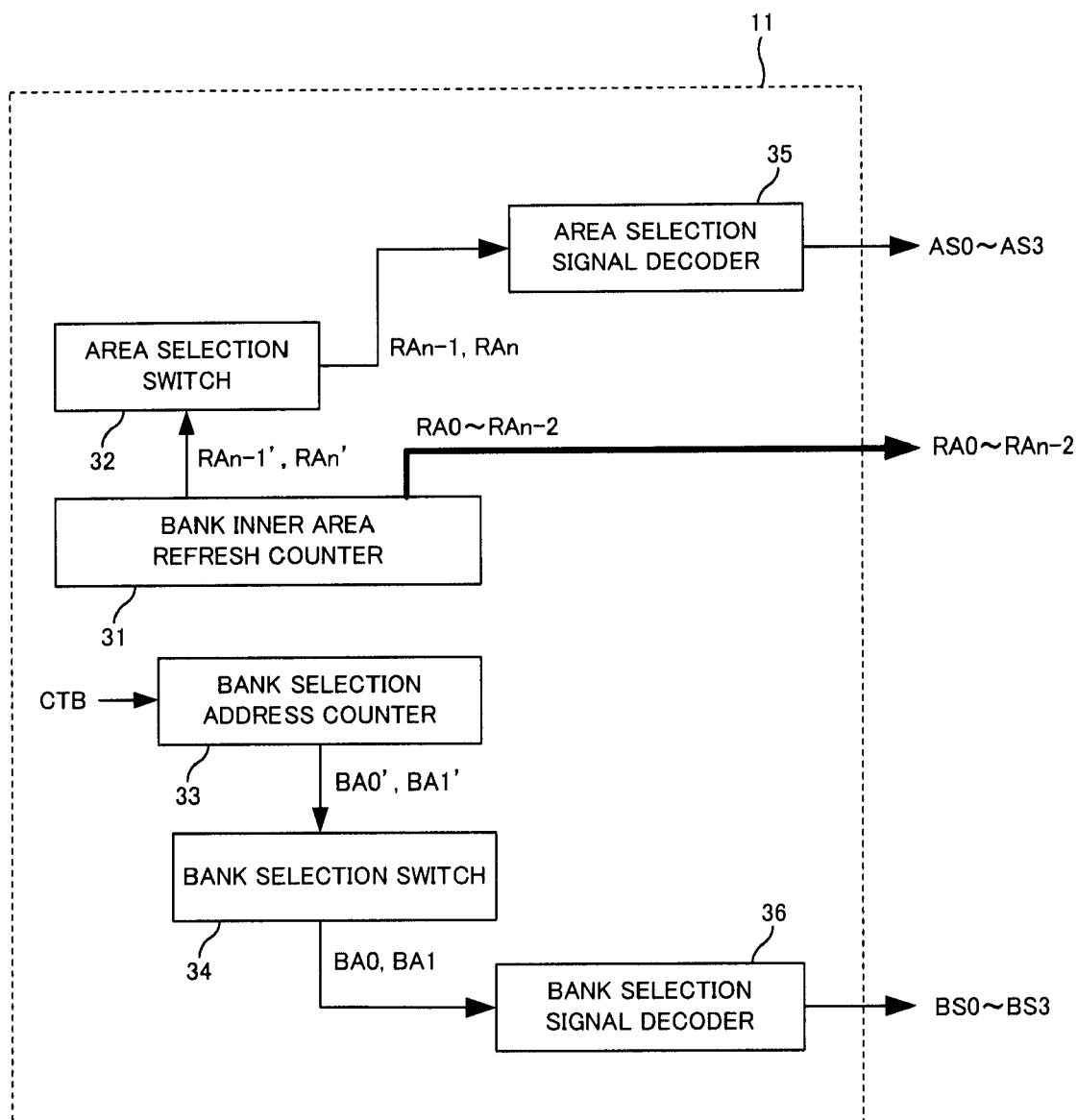
FIG. 19 is a diagram showing a configuration of a refresh control circuit in a second embodiment.

Operation of the first embodiment when the simultaneous refresh for four banks is designated will be described with reference to FIGS. 18A and 18B. Designations of the banks and the areas of FIG. 18A are the same as those of FIGS. 16A and 17A, and designations of the banks and the areas of FIG. 18B are the same as those of FIGS. 16B and 17B. The bits S0 to S9 in the mode register correspond to a pattern of "1111101000" in FIG. 18A, and correspond to a pattern of "1100111100" in FIG. 18B.

The refresh operation based on the setting of FIG. 18A is started from first positions a0s, a1s, a2s and a3s of the banks 0 to 3 simultaneously, and the refresh address is counted up for each bank. In this case, the refresh operation is performed for two word lines of the banks 0 and 2 which are to be refreshed, but is not performed for two word lines of the banks 1 and 3 which are not to be refreshed. When the respective refresh positions simultaneously reach last positions a0e, a1e, a2e and a3e of the banks 0 to 3, control is finished. In this manner, by comparing FIG. 18A with FIG. 16.A, if the count-up operations of the refresh address are controlled at the same timings, the entire memory cell array 10 can be refreshed with a quarter the number of refresh operations.

The refresh operation based on the setting of FIG. 18B is started from the first positions a0s to a3s of the banks 0 to 3 simultaneously as the same in FIG. 18A. As the refresh address is counted up, corresponding refresh operation for each of four selected word lines is performed. Then, after reaching the midpoint position in each bank, the corresponding refresh operation is not performed. Thereafter, the refresh address continues to be counted up, and when the refresh positions simultaneously reach the last positions a0e and a3e of the banks 0 to 3, control is finished. Herein, the count-up operation is performed in the same manner as in FIG. 18A, but the refresh operation for each bank is switched at the same timings as in FIGS. 16B and 17B.

As described above, it is possible to selectively set various conditions in the DRAM of the first embodiment. Particularly, the area designation data, the bank designation data and the method designation data in the mode register can be set differently for the self refresh mode and the auto refresh mode respectively, so that optimum refresh controls can be realized in terms of utilization and system requirement. In this case, the frequency of refresh reduces as the portions to be refreshed decrease, and thereby reducing consumption current. Further, it is possible to select an optimum setting for both a case in which data to be refreshed and data not to be refreshed are stored in different banks 0 to 3 from each other, and a case in which these data are stored in different areas from each other in the bank. For example, when accessing the DRAM in a bank interleave mode, the areas A0 to A3 can be designated for data existing in different bank, and thus a decrease in access efficiency due to a decrease in the number of banks can be prevented so as to achieve high convenience.

Second Embodiment

In a DRAN of a second embodiment, a basic configuration is common to that of the DRAM of the first embodiment. Thus, the essential configuration of FIG. 1, the data configuration of the mode register of FIG. 2, and the setting examples for the refresh operation of FIGS. 3 to 11B are common to the second embodiment, so description thereof will be omitted. Meanwhile, in the second embodiment, a configuration and operation of the refresh control circuit 11 are different from those in the first embodiment.

A configuration of the refresh control circuit 11 in the second embodiment will be described with reference to FIGS. 19 to 25. As shown in a block diagram of FIG. 19. The refresh control circuit 11 of the second embodiment includes a bank inner area refresh counter 31, an area selection switch 32, a bank selection address counter 33, a bank selection switch 34, an area selection signal decoder 35 and a bank selection signal decoder 36.

Figure 20A:
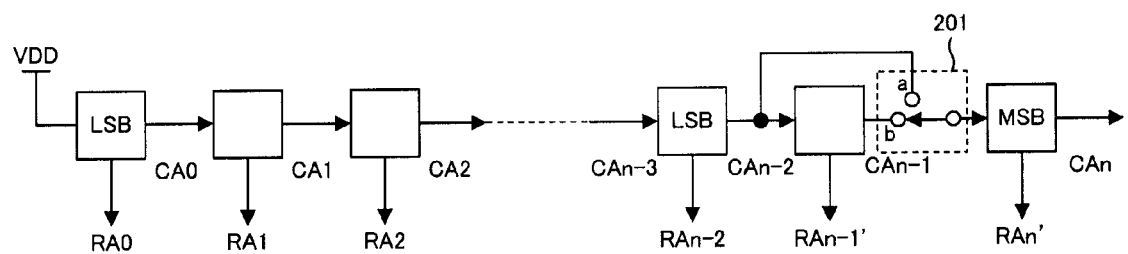
FIG. 20A is a diagram showing a configuration of a bank inner area refresh counter of FIG. 19.
Figure 20B:
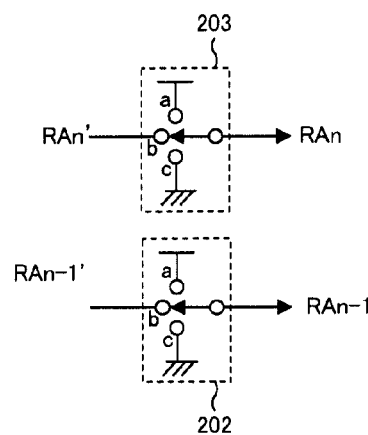
FIG. 20B is a diagram showing a configuration of a bank selection address counter of FIG. 19.

FIG. 20A shows a configuration of the bank inner area refresh counter 31, and FIG. 20B shows a configuration of the area selection switch 32. As shown in FIG. 20A, in the bank inner area refresh counter 31, a switch 201 is provided in addition to the configuration of the binary counter circuit as in FIG. 13A of the first embodiment. The bank inner area refresh counter 31 outputs (n−1) bit refresh address RA0 to RAn−2 of stages from a first stage to an (n−1)th stage, and outputs 2-bit address RAn−1' and RAn' of an n-th stage and a last stage.

The switch 201 switches the input side of the last stage counter to be selectively connected to respective output sides of the (n−1)th and n-th stage counters. When a path "a" is switched and connected to the switch 201, the n-th stage counter is bypassed, and the (n−1)th stage counter is directly connected to the last counters. When a path "b" is switched and connected to the switch 201, respective counters are successively connected through the (n−1) and n-th counters to the last counter.

Meanwhile, as shown in FIG. 20B, the area selection switch 32 includes two switches 202 and 203. The bit RAn−1' from the bank inner area refresh counter 31 is input to the switch 202, and the bit RAn−1 of the refresh address is output from the switch 202. The bit RAn' from the bank inner area refresh counter 31 is input to the switch 203, and the bit RAn of the refresh address is output from the switch 203. Output sides of the two switches 202 and 203 are connected to a power supply (high) when a path "a" is switched and connected, are directly connected to the input sides when a path "b" is switched and connected, and are connected to ground (low) when a path "c" is switched and connected.

Hereinafter, a relation between control states of the switches 201 to 203 and settings for the refresh operation will be described with reference to FIG. 21. In FIG. 21, the control states of the switches 201 to 203 are shown corresponding to whether or not the areas A0 to A3 in the bank is to be refreshed, and to the bits S0 to S3 of the area designation data in the mode register. A relation between the control states and a carry signal CTB described later which is sent to the bank selection address counter 33 is also shown.

By paying attention to the carry signal CTB, the number of areas to be refreshed in one bank is changed by this signal. Specifically, regarding the areas A0 to A3 of FIG. 21, when all the four areas are to be refreshed, CTB=CAn is set, when two of the four areas are to be refreshed, CTB=CAn−1 is set, and when one of the four areas is to be refreshed CTB=CAn−2 is set. That is, the shifting timing in each bank is controlled based on the carry signal CTB, and specific description thereof will be described later.

When all the four areas are to be refreshed, all the switches 201 to 203 are switched to the path "b", and the refresh address RA0 to RAn is normally counted up. When two of the four areas are to be refreshed, one or two of the switches 201 to 203 are switched to the path "a" or "c" and are fixed to high or low. Therefore, an address space of the refresh address RA0 to RAn is reduced by half. When one of the four areas is to be refreshed, both the switches 202 and 203 are switched to the path "a" or "c" and are fixed to high or low. Therefore, the address space of the refresh address RA0 to RAn is reduced by a quarter.

Figure 22A:
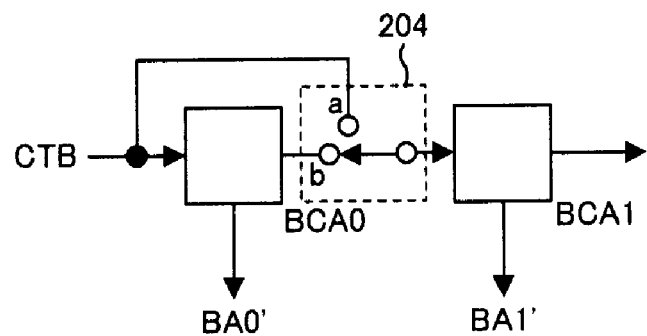
FIG. 22A is a diagram showing a configuration of an address counter of FIG. 19.
Figure 22B:
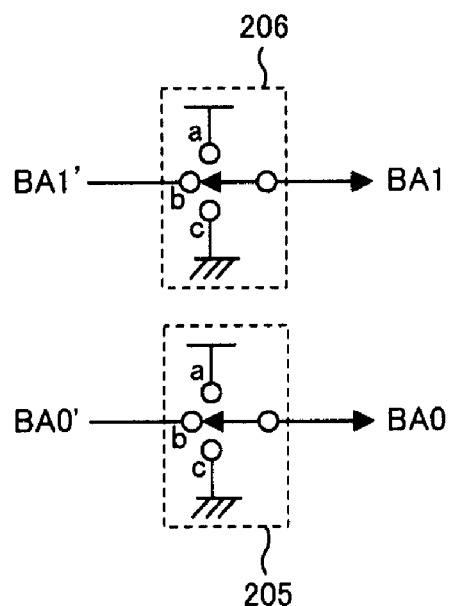
FIG. 22B is a diagram showing a configuration of a bank selection switch of FIG. 19.

FIG. 22A shows a configuration of the bank selection address counter 33, and FIG. 22B shows a configuration of the bank selection switch 34. As shown in FIG. 22A, the bank selection address counter 33 outputs 2-bit address BA0' and BA1' as a count value. A switch 204 is provided in addition to the 2-stage binary counter circuit having the first stage inputting the carry signal CTB of FIG. 21 and outputting the bit BA0' and the last stage outputting the bit BA1'. The switch 204 switches the input side of the last stage counter to be selectively connected to the carry signal CTB or the output side of the first stage counter. When a path "a" is switched and connected to the switch 204, the first stage counter is bypassed, so that the switch 204 has only the last stage counter. When a path "b" is switched and connected to the switch 204, the two stage binary counter is configured as in FIG. 13B.

Meanwhile, as shown in FIG. 22B, the bank selection switch 34 includes two switches 205 and 206. The bit BA0' from the bank selection address counter 33 is input to the switch 205, and the bit BA0 of the bank selection address is output from the switch 205. The bit BA1' from the bank selection address counter 33 is input to the switch 206, and the bit BA1 of the bank selection address is output from the switch 206. Output sides of the two switches 205 and 206 are connected to the power supply (high) when a path "a" is switched and connected, are directly connected to the input sides when a path "b" is switched and connected, and are connected to ground (low) when a path "c" is switched and connected.

Hereinafter, a relation between control states of the switches 204 to 206 and the banks to be refreshed will be described with reference to FIG. 23. In FIG. 23, regarding whether or not the banks 0 to 3 are to be refreshed, the control states of the switches 204 to 206 are shown corresponding to the bits S4 to S7 of the bank designation data in the mode register. As shown in FIG. 23, regarding the banks 0 to 3, when all the banks are to be refreshed, all the switches 204 to 206 are switched to the path "b", while when the two banks or one bank of the four banks are to be refreshed, one or two of the switches 204 to 206 are switched to the path "a" or "c".

Figure 24:
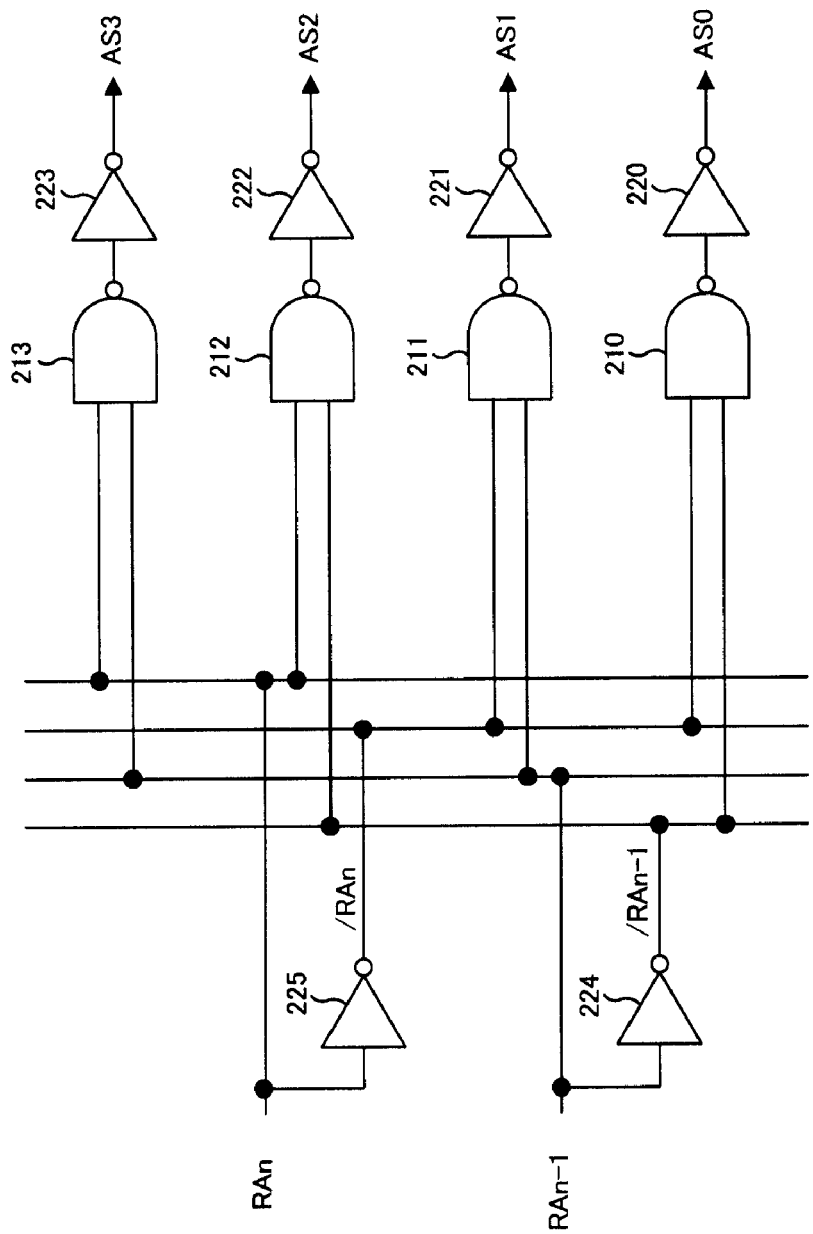
FIG. 24 is a diagram showing a configuration of an area selection signal decoder of FIG. 19.

FIG. 24 shows a configuration of the area selection signal decoder 35. As shown in FIG. 24, the area selection signal decoder 35 includes four NAND gates 210 to 213 and six inverters 220 to 225. Upper two bits RAn−1 and RAn of the refresh address is input to the area selection signal decoder 35, and the 4-bit area selection signals AS0 to AS3 are output from the area selection signal decoder 35. By comparing with FIG. 14 of the first embodiment, differences exist in that switches are not provided and each NAND gate has two input terminals in FIG. 24, and otherwise the connection relation in FIG. 24 is common to that in FIG. 14.

Figure 25:
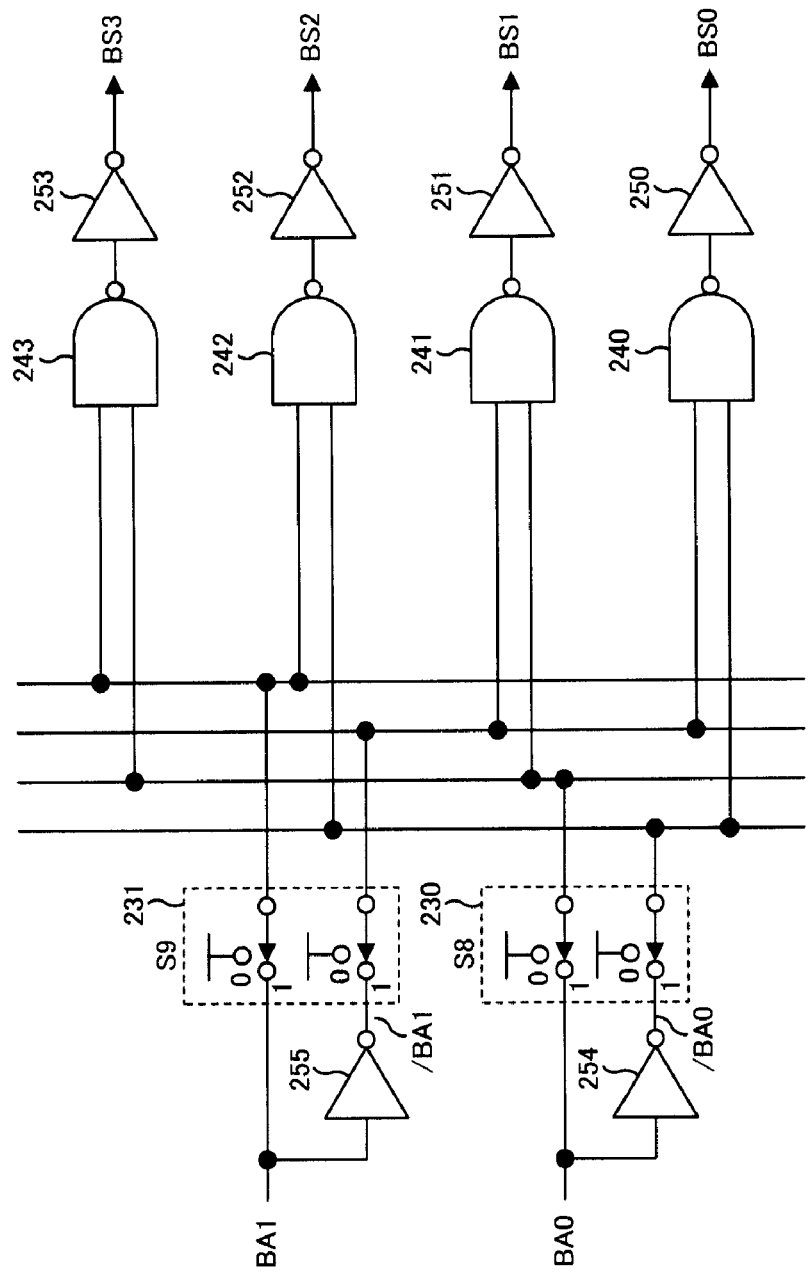
FIG. 25 is a diagram showing a configuration of a bank selection signal decoder of FIG. 19.

FIG. 25 shows a configuration of the bank selection signal decoder 36. As shown in FIG. 25, the bank selection signal decoder 36 includes two switches 230 and 231, four NAND gates 240 to 243 and six inverters 250 to 255. The bank selection address BA0 and BA1 from the bank selection switch 34 is input to the bank selection signal decoder 36, and the 4-bit bank selection signals BS0 to BS3 are output. By comparing with FIG. 15 of the first embodiment, differences exist in that switches are not provided on the input side of the NAND gates 240 to 243 each having two input terminals, and otherwise the connection relation in FIG. 25 is common to that in FIG. 15.

Next, refresh operation of the second embodiment will be described with reference to FIGS. 26A to 28B in comparison with FIGS. 16A to 18B of the first embodiment. The following description is common to both the self refresh operation performed in the self refresh mode and the auto refresh operation performed in the auto refresh mode.

Figure 26A:
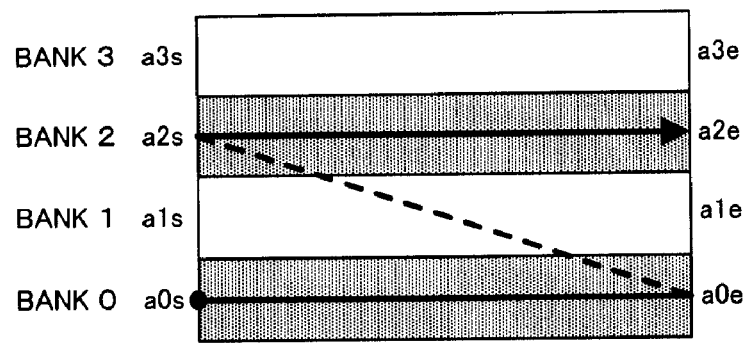
FIGS. 26A and 26B are diagrams showing operation of the second embodiment when the refresh for each single bank is designated.
Figure 26B:
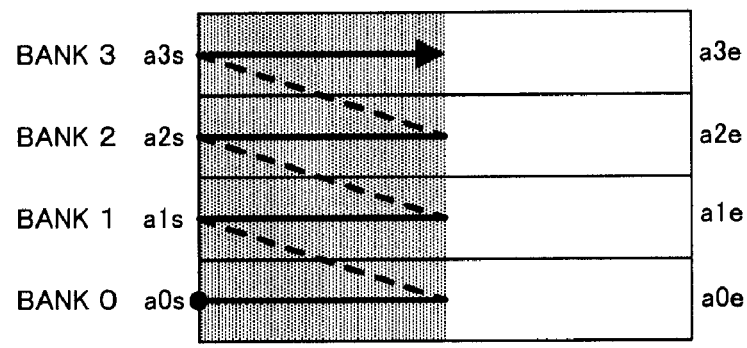

Operation of the second embodiment when the refresh for each single bank is designated will be described with reference to FIGS. 26A and 26B. FIG. 26A shows an operation in which all the areas A0 to A3 in two banks 0 and 2 are designated to be refreshed. FIG. 26B shows an operation in which the areas A0 and A1 in all the banks (half of each bank) are designated to be refreshed. The respective settings of the mode register are the same as those in FIGS. 16A and 16B of the first embodiment.

The refresh operation based on the setting of FIG. 26A is started from the first position a0s of the bank 0, and as the refresh address is counted up, a corresponding refresh operation for a selected word line is performed. When the refresh position reaches the last position a0e of the bank 0, the bank 1 not to be refreshed is skipped to shift to the first position a2s of the bank 2. Then, the same control is performed for the bank 2 as for the bank 0. When the refresh position reaches the last position a2e of the bank 2, control is finished at this point because the bank 3 is not to be refreshed. In this manner, since the numbers of the count-up operations and the refresh operations are determined in accordance with the number of the banks to be refreshed, the refresh period for each memory cell can be shortened compared with FIG. 16A of the first embodiment in a case of setting the same interval for the count-up operation.

The refresh operation based on the setting of FIG. 26B is started from the first position a0s of the bank 0. The count up operation for the areas A0 and A1 is performed in the same manner described above, and a corresponding refresh operation for a selected word line is performed. Then, after reaching a midpoint position in each bank, the areas A2 and A3 not to be refreshed are skipped to shift to the first position a1s of the bank 1. Then, the same control is performed for the bank 1 as for the bank 0, and thereafter the same control is performed for the banks 2 and 3 successively. In this manner, since the numbers of the count-up operations and the refresh operations are determined in accordance with the number of the areas to be refreshed, the refresh period for each memory cell can be shortened compared with FIG. 16B of the first embodiment in a case of setting the same interval for the count-up operation.

Figure 27A:
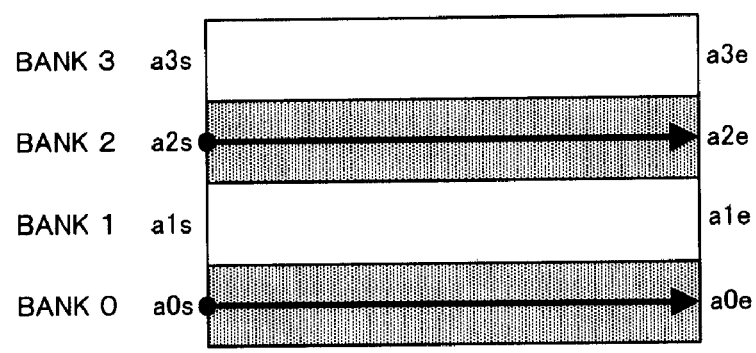
FIGS. 27A and 27B are diagrams showing operation of the second embodiment when the simultaneous refresh for two banks is designated.
Figure 27B:
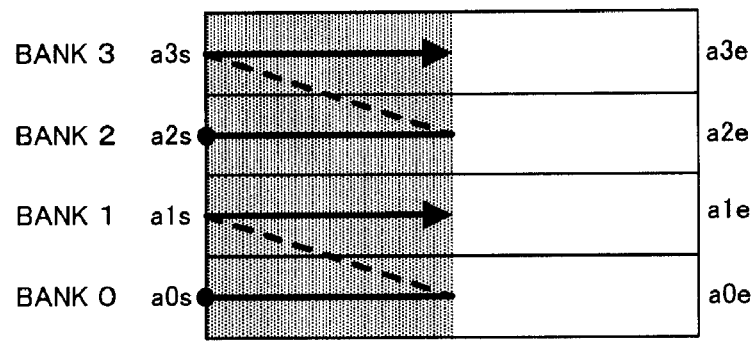

Operation of the second embodiment when the simultaneous refresh for two banks is designated will be described with reference to FIGS. 27A and 27B. Designations of the banks and the areas of FIGS. 27A and 27B are the same as those in FIGS. 26A and 26B respectively. The setting of the mode register is the same as that in FIGS. 17A and 17B of the first embodiment.

The refresh operations based on the setting of FIG. 27A is started simultaneously from the first positions a0s and a2s of the banks 0 and 2, and as the refresh address is counted up, corresponding refresh operations for selected two word lines are performed. When the refresh positions simultaneously reach the last positions a0e and a2e of the banks 0 and 2, subsequent refresh operations are not performed and control is finished at this point because other banks 1 and 3 are not to be refreshed. In this manner, the refresh period for each memory cell can be shortened compared with FIG. 17A of the first embodiment in a case of setting the same interval for the count-up operation, and the refresh period can be shortened by half compared with FIG. 26A.

The refresh operations based on the setting of FIG. 27B is started simultaneously from the first positions a0s and a2s of the banks 0 and 2. The count up operations for the areas A0 and A1 are performed in the same manner described above, corresponding refresh operations for selected two word lines are performed. Then, after reaching a mid position of each bank, the areas A2 and A3 not to be refreshed are skipped to shift to the first positions a1s and a3s of the banks 1 and 3. The same control is performed for the banks 1 and 3 as for the banks 0 and 2, and when reaching mid points of the banks 1 and 3, control is finished. In this manner, the refresh period for each memory cell can be shortened compared with FIG. 17B of the first embodiment in a case of setting the same interval for the count-up operation, and the refresh period can be shortened by half compared with FIG. 26B.

Figure 28A:
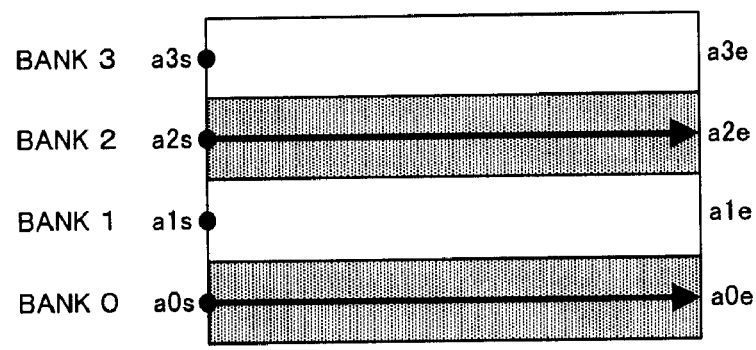
FIGS. 28A and 28B are diagrams showing operation of the second embodiment when the simultaneous refresh for four banks is designated.
Figure 28B:
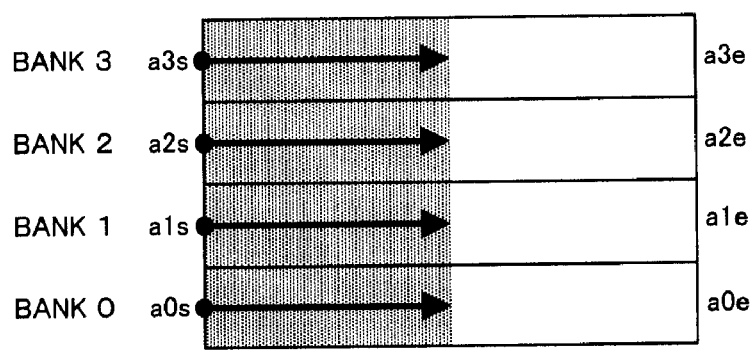

Operation of the second embodiment when the simultaneous refresh for four banks is designated will be described with reference to FIGS. 28A and 28B. Designations of the banks and the areas of FIG. 28A are the same as those in FIGS. 26A and 27A, and designations of the banks and the areas of FIG. 28B are the same as those in FIGS. 26B and 27B. The setting of the mode register is the same as that in FIGS. 18A and 18B of the first embodiment.

The refresh operations based on the setting of FIG. 28A are started simultaneously from the first positions a0s and a2s of the banks 0 and 2 to be refreshed among the banks 0 to 3, and as each refresh address is counted up, corresponding refresh operations for selected two word lines are performed. The refresh operations for the banks 1 and 3 not to be refreshed are not performed. When the refresh positions simultaneously reach the last positions a0e and a2e of the banks 0 and 2, control is finished. In this case, refresh control in FIG. 28A is the same as that in FIG. 18A of the first embodiment regardless of the number of banks to be refreshed, and is also the same as that in FIG. 27A.

The refresh operations based on the setting of FIG. 28B is started simultaneously from the first positions a0s, a1s, a2s and a3s of the banks 0 to 3, and as each refresh address is counted up, corresponding refresh operations for selected four word lines are performed. Then, the count-up operations and the refresh operations are performed for the areas A0 and A1 to be refreshed. Thereafter, when reaching a mid point of each bank, control is finished. In this manner, the refresh period for each memory cell can be shortened by half compared with FIG. 18B of the first embodiment in a case of setting the same interval for the count-up operation, and the refresh period can be shortened by half compared with FIG. 27B.

As described above, in the DRAM of the second embodiment, it is possible to selectively set various conditions as in the first embodiment and additionally to set the frequency of refresh and the refresh period flexibly. That is, not only the refresh operation but also the count-up operation of the refresh address is not performed for portions not be refreshed, and therefore the refresh period for each memory cell can be adequately adjusted according to the frequency of refresh requests. For example, when giving priority to an improvement of the operating margin, the refresh period may be shortened as the portions to be refreshed are limited, while when giving priority to a reduction in consumption current, the frequency of the refresh may be reduced. If the frequency of refresh request is reduced, it is also effective to reduce the refresh busy rate. Determining to which factor the priority is given depends on respective situations, which are different from each other, of the self refresh mode and the auto refresh mode, and thus refresh control with an optimum setting for the both modes can be realized.

In the foregoing, the present invention is specifically described based on the embodiments. However, the present invention is not limited to the above described embodiments, and can be variously modified without departing the essentials of the present invention. For example, the bank configuration or the area division of the memory cell array 10, the configuration of the refresh control circuit 10, assignment of the mode register, and the like can be variously modified without being limited to the above-mentioned specific examples. Therefore, the present invention can be widely applied to a semiconductor memory device.

The present invention is not limited to the above described embodiments, and various variations and modifications may be possible without departing from the scope of the present invention.

This application is based on the Japanese Patent applications No. 2006-225851 filed on Aug. 22, 2006, entire content of which is expressly incorporated by reference herein.

What is claimed is:

1. A semiconductor memory device in which refresh operation for a memory cell array including a plurality of memory cells is performed, comprising:
   refresh control means for switchingly controlling a first refresh mode in which access to the memory cell array from outside is prohibited while retaining data and a second refresh mode in which access to the memory cell array from outside is permitted while retaining data and for performing the refresh operation of the memory cells corresponding to a selected word line; and
   designating means for individually designating a portion to be refreshed in the first refresh mode and a portion to be refreshed in the second refresh mode,
   wherein, in controlling the first or second refresh mode, said refresh control means performs the refresh operation when the portion to which the selected word line belongs is designated to be refreshed, and does not perform the refresh operation when the portion to which the selected word line belongs is not designated to be refreshed.

2. The semiconductor memory device according to claim 1, wherein portions different from each other can be designated to be refreshed in the respective first and second refresh modes by said designating means.

3. The semiconductor memory device according to claim 1, wherein the memory cell array is divided into a plurality of banks,
   and wherein said designating means selectively designates one or more banks to be refreshed among the plurality of banks and selectively designates one or more bank inner areas to be refreshed among a plurality of bank inner areas into which the designated bank is divided, regarding the respective first and second refresh modes.

4. The semiconductor memory device according to claim 3, wherein said designating means stores N-bit bank designation data for setting whether or not each of N banks is to be refreshed and M-bit area designation data for setting whether or not each of M areas is to be refreshed, regarding the respective first and second refresh modes.

5. The semiconductor memory device according to claim 4, wherein said designating means stores the N-bit bank designation data and the M-bit area designation data in a mode register based on input data from outside, regarding the respective first and second refresh modes.

6. The semiconductor memory device according to claim 3, wherein said refresh control means generates a refresh address corresponding to a row address of the selected word line, a bank selection signal for selecting a bank to which the selected word line belongs, and an area selection signal for selecting an area to which the selected word line belongs respectively, and supplies the generated signals to the memory cell array.

7. The semiconductor memory device according to claim 6, wherein said refresh control means performs the refresh operation while sequentially counting the refresh address in the portion to be refreshed, and does not perform the refresh operation while sequentially counting the refresh address in the portion not to be refreshed.

8. The semiconductor memory device according to claim 6, wherein said refresh control means performs the refresh operation while sequentially counting the refresh address in the portion to be refreshed, and shifts a refresh position to a subsequent portion to be refreshed without counting the refresh address in the portions not to be refreshed.

9. The semiconductor memory device according to claim 6, wherein said refresh control means selects each single bank among N banks, and counts the refresh address corresponding to a single selected word line successively.

10. The semiconductor memory device according to claim 6, wherein said refresh control means selects a predetermined number of banks among N banks, and counts the refresh address corresponding to each of the predetermined number of selected word lines simultaneously.

11. The semiconductor memory device according to claim 6, wherein said refresh control means selects all N banks, and counts the refresh address corresponding to each of N selected word lines simultaneously.

12. The semiconductor memory device according to claim 1, wherein the first refresh mode is a self refresh mode in standby state and the second refresh mode is an auto refresh mode in normal operation.

13. A refresh control method of a semiconductor memory device in which a memory cell array including a plurality of memory cells is provided, comprising the steps of:
setting first designation data for designating a portion to be refreshed regarding a first refresh mode in which access to the memory cell array from outside is prohibited while retaining data;
setting second designation data for designating a portion to be refreshed regarding a second refresh mode in which access to the memory cell array from outside is permitted while retaining data;
controlling so that the first refresh mode is set, and based on the first designation data, the refresh operation is performed when a portion to which a selected word line belongs is designated to be refreshed, while the refresh operation is not performed when a portion to which the selected word line belongs is not designated to be refreshed; and
controlling so that the second refresh mode is set, and based on the second designation data, the refresh operation is performed when a portion to which the selected word line belongs is designated to be refreshed, while the refresh operation is not performed when a portion to which the selected word line belongs is not designated to be refreshed.

14. The refresh control method of the semiconductor memory device according to claim 13, wherein the first designation data and the second designation data are data for designating portions different from each other to be refreshed in the memory cell array.

15. The refresh control method of the semiconductor memory device according to claim 13, wherein the first designation data and the second designation data are data for designating the same portion as each other to be refreshed in the memory cell array.

16. The refresh control method of the semiconductor memory device according to claim 13, wherein the first designation data and the second designation data include bank designation data for selectively designating one or more banks to be refreshed among a plurality of banks into which the memory cell array is divided, and area designation data for selectively designating one or more bank inner areas to be refreshed among a plurality of bank inner areas into which the designated bank is divided, regarding the respective first and second refresh modes.

17. The refresh control method of the semiconductor memory device according to claim 16, wherein each of the plurality of the banks has the same size, and each of the plurality of bank inner areas is an area having the same size and successive row addresses in each bank.

18. The refresh control method of the semiconductor memory device according to claim 13, wherein when the total number of the selected word lines included in the portion to be refreshed decreases in the entire memory cell array, an average frequency of the refresh operations is reduced while a refresh period of each memory cell is maintained.

19. The refresh control method of the semiconductor memory device according to claim 13, wherein when the total number of the selected word lines included in the portion to be refreshed decreases in the entire memory cell array, an average frequency of the refresh operations is maintained while a refresh period of each memory cell is reduced.

* * * * *